(12) United States Patent
Hwang et al.

(10) Patent No.: US 12,218,206 B2
(45) Date of Patent: Feb. 4, 2025

(54) POWER SEMICONDUCTOR DEVICE AND METHOD OF MANUFACTURING THE SAME

(71) Applicant: Samsung Electronics Co., Ltd., Suwon-si (KR)

(72) Inventors: Sunkyu Hwang, Seoul (KR); Jongseob Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 356 days.

(21) Appl. No.: 17/685,886

(22) Filed: Mar. 3, 2022

(65) Prior Publication Data

US 2022/0320297 A1 Oct. 6, 2022

(30) Foreign Application Priority Data

Mar. 30, 2021 (KR) .......... 10-2021-0041267
Apr. 27, 2021 (KR) .......... 10-2021-0054645

(51) Int. Cl.
*H01L 29/08* (2006.01)
*H01L 29/20* (2006.01)
(Continued)

(52) U.S. Cl.
CPC ........ *H01L 29/401* (2013.01); *H01L 29/2003* (2013.01); *H01L 29/66462* (2013.01); *H01L 29/7787* (2013.01)

(58) Field of Classification Search
CPC ............... H01L 29/401; H01L 29/2003; H01L 29/66462; H01L 29/7787; H01L 29/42316;
(Continued)

(56) References Cited

U.S. PATENT DOCUMENTS

| 5,929,467 A | 7/1999 | Kawai et al. |
| 8,860,085 B2 | 10/2014 | Briere |

(Continued)

FOREIGN PATENT DOCUMENTS

| JP | 2012-227456 A | 11/2012 |
| KR | 10-0571071 B1 | 6/2006 |

(Continued)

OTHER PUBLICATIONS

Office Action dated Jun. 28, 2022 issued in corresponding Korean patent application No. 10-2021-0054645.
(Continued)

*Primary Examiner* — Niki H Nguyen
(74) *Attorney, Agent, or Firm* — HARNESS, DICKEY & PIERCE, P.L.C.

(57) ABSTRACT

A method of manufacturing a power semiconductor device includes forming a channel separation pattern on a substrate; forming a passivation layer on the substrate and the channel separation pattern; forming a gate hole, a source hole, and a drain hole penetrating the passivation layer in a same process step; and simultaneously forming a gate electrode pattern, a source electrode pattern, and a drain electrode pattern. The gate electrode pattern may be formed on the channel separation pattern. A side surface of the gate electrode pattern and a side surface of the channel separation pattern may have a step difference.

20 Claims, 18 Drawing Sheets

(51) Int. Cl.
*H01L 29/40* (2006.01)
*H01L 29/66* (2006.01)
*H01L 29/778* (2006.01)

(58) Field of Classification Search
CPC ............... H01L 29/1029; H01L 29/432; H01L 29/0843; H01L 29/1608; H01L 29/1095; H01L 2924/13064; H01L 29/66712; H01L 29/7802; H01L 29/0696; H01L 29/4908; H01L 2924/13055; H01L 2224/08147; H01L 2224/08145; H01L 29/66333
See application file for complete search history.

(56) References Cited

U.S. PATENT DOCUMENTS

| | | |
|---|---|---|
| 9,224,846 B2 | 12/2015 | Shin et al. |
| 10,797,168 B1 | 10/2020 | Moens et al. |
| 10,964,788 B1 * | 3/2021 | Chen ................. H01L 29/66462 |
| 2013/0193485 A1 | 8/2013 | Akiyama et al. |
| 2015/0123139 A1 | 5/2015 | Kim et al. |
| 2016/0035847 A1 | 2/2016 | Cao et al. |
| 2016/0268409 A1 | 9/2016 | Ogawa et al. |
| 2021/0184010 A1 | 6/2021 | Chong et al. |

FOREIGN PATENT DOCUMENTS

| | | | |
|---|---|---|---|
| KR | 10-215-0039481 A | * | 4/2015 |
| KR | 10-2015-0039481 A | | 4/2015 |
| KR | 10-2015-0051822 A | | 5/2015 |
| KR | 10-2016-0080404 A | | 7/2016 |
| KR | 10-2087941 B1 | | 3/2020 |
| KR | 10-2080745 B1 | | 4/2020 |

OTHER PUBLICATIONS

Extended European Search Report dated Aug. 24, 2022 issued in corresponding European patent application No. 22162734.2.

* cited by examiner

POWER SEMICONDUCTOR DEVICE AND METHOD OF MANUFACTURING THE SAME

CROSS-REFERENCE TO RELATED APPLICATIONS

This application is based on and claims priority under 35 U.S.C. § 119 to Korean Patent Application Nos. 10-2021-0041267, filed on Mar. 30, 2021, and 10-2021-0054645, filed on Apr. 27, 2021, in the Korean Intellectual Property Office, the disclosures of which are incorporated by reference herein in their entireties.

BACKGROUND

1. Field

The disclosure relates to a power semiconductor device and/or a method of manufacturing the same.

2. Description of the Related Art

Power semiconductor devices are used for power conversion and/or power control. The power semiconductor devices generally may require high withstand voltages, large current, and high-speed switching characteristics. An example of the power semiconductor devices is a high electron mobility transistor (HEMT). The HEMT includes a heterojunction structure in which semiconductor material layers having different band gaps are formed adjacent to each other. As materials having different band gaps are formed into a heterojunction structure, a two-dimensional electron gas (2DEG) layer is induced in a semiconductor material layer having a small band gap, so that the movement speed of electrons may be improved.

SUMMARY

The disclosure provides a power semiconductor device having improved electrical characteristics.

The disclosure provides a method of manufacturing a power semiconductor device having improved electrical characteristics.

The disclosure provides a method of manufacturing a power semiconductor device having improved process efficiency.

However, the disclosure is not limited thereto.

Additional aspects will be set forth in part in the description which follows and, in part, will be apparent from the description, or may be learned by practice of the presented embodiments of the disclosure.

According to an embodiment, a method of manufacturing a power semiconductor device may include forming a channel separation pattern on a substrate; forming a passivation layer on the substrate and the channel separation pattern; and forming a gate electrode pattern, a source electrode pattern, and a drain electrode pattern penetrating the passivation layer in a same process step. The gate electrode pattern may be formed on the channel separation pattern, and a side surface of the gate electrode pattern and a side surface of the channel separation pattern may have a step difference.

In some embodiments, the forming the gate electrode pattern, the source electrode pattern, and the drain electrode pattern may include forming a gate hole, a source hole, and a drain hole penetrating the passivation layer; filling the gate hole, the source hole, and the drain hole by depositing a conductive material layer on the passivation layer; and patterning the conductive material layer. The gate electrode pattern, the source electrode pattern, and the drain electrode pattern may be formed in the gate hole, the source hole, and the drain hole, respectively.

In some embodiments, the gate electrode pattern may include an electric field relaxation region extending toward the drain electrode pattern along an upper surface of the passivation layer, and a distance between the electric field relaxation region and the drain electrode pattern may be less than a distance between the channel separation pattern and the drain electrode pattern.

In some embodiments, the method may further include forming a Schottky barrier metal pattern between the channel separation pattern and the gate electrode pattern.

In some embodiments, the Schottky barrier metal pattern may extend between the gate electrode pattern and the passivation layer.

In some embodiments, the method may further include forming an electric field relaxation pattern between the gate electrode pattern and the drain electrode pattern; and the electric field relaxation pattern may be formed in the same process step as the gate electrode pattern, the source electrode pattern, and the drain electrode pattern.

In some embodiments, the forming of the gate electrode pattern, the source electrode pattern, the drain electrode pattern, and the electric field relaxation pattern may include forming a gate hole, a source hole, and a drain hole penetrating the passivation layer; filling the gate hole, the source hole, and the drain hole by depositing a conductive material layer on the passivation layer; and patterning the conductive material layer.

In some embodiments, the gate electrode pattern, the source electrode pattern, and the drain electrode pattern may include a same conductive material.

In some embodiments, the channel separation pattern may include p-type gallium nitride (GaN).

According to an embodiment, a method of manufacturing a power semiconductor device may include forming a channel separation pattern on a substrate; forming a passivation layer on the substrate and the channel separation pattern; and forming a gate hole, a source hole, and a drain hole penetrating the passivation layer; forming a Schottky barrier metal pattern in the gate hole; and forming a source electrode pattern and a drain electrode pattern in the source hole and the drain hole in a same process step. The channel separation pattern may be exposed by the gate hole. The Schottky barrier metal pattern may be electrically connected to the channel separation pattern. A side surface of the Schottky barrier metal pattern and a side surface of the channel separation pattern may have a step difference.

In some embodiments, the method may further include forming an additional source electrode pattern and an additional drain electrode pattern on the source electrode pattern and the drain electrode pattern, respectively; and the additional source electrode pattern and the additional drain electrode pattern may be formed in the same process step as the Schottky barrier metal pattern.

In some embodiments, the additional source electrode pattern and the additional drain electrode pattern may include a same conductive material as the Schottky barrier metal pattern.

In some embodiments, the additional source electrode pattern and the additional drain electrode pattern may completely cover the source electrode pattern and the drain electrode pattern, respectively.

In some embodiments, the additional source electrode pattern and the additional drain electrode pattern may partially cover the source electrode pattern and the drain electrode pattern, respectively.

In some embodiments, the source electrode pattern may be exposed between the additional source electrode pattern and the passivation layer, and the drain electrode pattern may be exposed between the additional drain electrode pattern and the passivation layer.

In some embodiments, the Schottky barrier metal pattern may include an electric field relaxation region extending toward the drain electrode pattern along an upper surface of the passivation layer, and a distance between the electric field relaxation region and the drain electrode pattern may be less than a distance between the channel separation pattern and the drain electrode pattern.

In some embodiments, the channel separation pattern may include p-type gallium nitride (GaN).

In some embodiments, the forming the Schottky barrier metal pattern may be performed before the source electrode pattern and the drain electrode pattern are formed.

In some embodiments, the forming the source electrode pattern and the drain electrode pattern may be performed before the Schottky barrier metal pattern is formed.

According to an embodiment, a power semiconductor device may include a substrate including a channel; a channel separation pattern on the substrate; a passivation layer on the substrate and the channel separation pattern, the passivation layer including a gate hole, a source hole, and a drain hole penetrating the passivation layer; and a gate electrode pattern, a source electrode pattern, and a drain electrode pattern in the gate hole, the source hole, and the drain hole, respectively, and extending onto an upper surface of the passivation layer. A side surface of the gate electrode pattern in the gate hole and a side surface of the channel separation pattern may have a step difference.

In some embodiments, the gate electrode pattern, the source electrode pattern, and the drain electrode pattern may include a same conductive material.

In some embodiments, the power semiconductor device may further include a Schottky barrier metal pattern between the gate electrode pattern and the channel separation pattern, and the Schottky barrier metal pattern may include a conductive material different from those of the gate electrode pattern, the source electrode pattern, and the drain electrode pattern.

In some embodiments, the channel separation pattern may include p-type gallium nitride (GaN).

According to an embodiment, a power semiconductor device may include a substrate including a channel; a channel separation pattern on the substrate; a passivation layer on the substrate and the channel separation pattern; the passivation layer including a gate hole, a source hole, and a drain hole penetrating the passivation layer; and a Schottky barrier metal pattern, a source electrode pattern, and a drain electrode pattern in the gate hole, the source hole, and the drain hole, respectively, and extending onto an upper surface of the passivation layer. A side surface of the Schottky barrier metal pattern in the gate hole and a side surface of the channel separation pattern may have a step difference.

In some embodiments, the power semiconductor device may further include an additional source electrode pattern and an additional drain electrode pattern on the source electrode pattern and the drain electrode pattern, respectively; and the additional source electrode pattern and the additional drain electrode pattern may include a same conductive material as the Schottky barrier metal pattern.

In some embodiments, the channel separation pattern may include p-type gallium nitride (GaN).

According to an example embodiment, a power semiconductor device may include a substrate including a channel; a channel separation pattern on the substrate; a passivation layer on the substrate and the channel separation pattern, the passivation layer including a gate hole, a source hole, and a drain hole penetrating the passivation layer; and a gate structure, a source electrode pattern, and a drain electrode pattern in the gate hole, the source hole, and the drain hole, respectively, and extending onto an upper surface of the passivation layer. A width of a bottom surface of the gate structure in a first direction may be less than a width of an upper surface of the channel separation pattern in the first direction.

In some embodiments, the gate structure may include a gate electrode pattern directly contacting the channel separation pattern. A side surface of a portion of the gate electrode pattern in the gate hole and a side surface of the channel separation pattern may have a step difference.

In some embodiments, the gate structure may include a Schottky barrier metal pattern on the channel separation pattern.

In some embodiments, a side surface of a portion of the Schottky barrier metal pattern in the gate hole and a side surface of the channel separation pattern may have a step difference.

In some embodiments, the channel separation pattern may include p-type gallium nitride (GaN).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
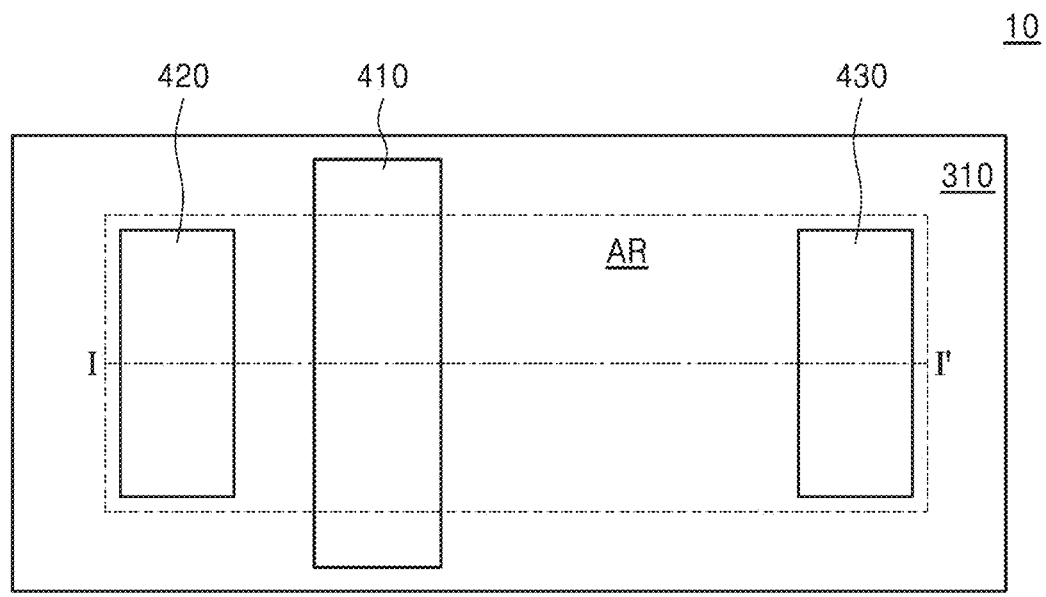
FIG. 1 is a plan view of a power semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, embodiments of the disclosure will be described in detail with reference to the accompanying drawings. In the following drawings, the same reference numerals refer to the same elements, and the size of each element in the drawings may be exaggerated for clarity and convenience of description. However, the embodiments to be described below are merely examples, and various modifications may be made from these embodiments.

Hereinafter, what is referred to as "on" an element may include those that are in contact with and directly over the element as well as those that are over the element but are not in contact therewith.

Singular expressions may include plural expressions unless the context clearly indicates otherwise. Also, when a portion "includes" a certain element, it may indicate that another element may be further included, rather than excluding the other element, unless otherwise stated.

In addition, the term such as " . . . unit", " . . . portion", " . . . module", or the like described in the specification refers to a unit that processes at least one function or operation.

Figure 2:
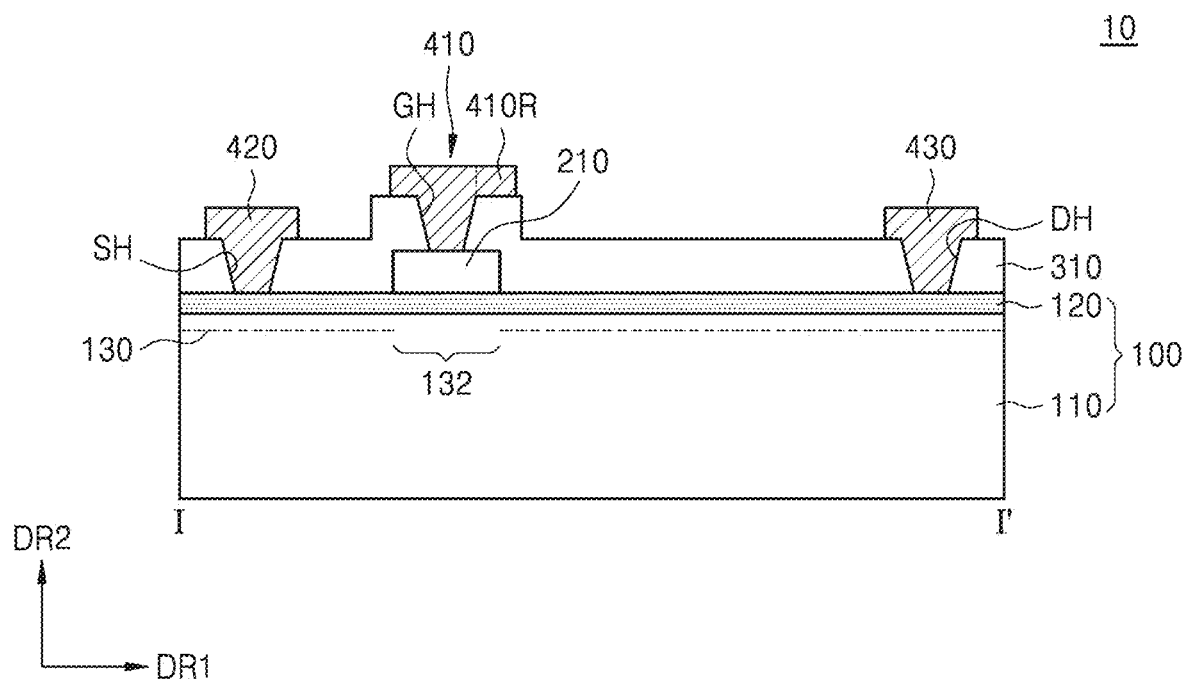
FIG. 2 is a cross-sectional view of a power semiconductor device taken along line I-I' of FIG. 1.

FIG. 1 is a plan view of a power semiconductor device according to an embodiment. FIG. 2 is a cross-sectional view of a power semiconductor device taken along line I-I' of FIG. 1.

Referring to FIGS. 1 and 2, a power semiconductor device 10 may be provided. For example, the power semiconductor device 10 may include a high electron mobility transistor (HEMT). The power semiconductor device 10 may include a substrate 100, a channel separation pattern 210, a gate electrode pattern 410, a passivation layer 310, a source electrode pattern 420, and a drain electrode pattern 430. The substrate 100 may include a channel layer 110 and a channel supply layer 120. The channel layer 110 may include a III-V series compound semiconductor. For example, the channel layer 110 may include gallium nitride (GaN). The substrate 100 may include an active region AR in which the power semiconductor device 10 is formed.

The channel supply layer 120 may be provided on the channel layer 110. The channel supply layer 120 may be a semiconductor layer different from the channel layer 110. The channel supply layer 120 may form a 2-dimensional electron gas (2DEG) layer 130 in the channel layer 110. For example, the 2DEG layer 130 may include a channel of the power semiconductor device 10. The 2DEG layer 130 may be formed in the channel layer 110 adjacent to an interface between the channel supply layer 120 and the channel layer 110. For example, the 2DEG layer 130 may extend in a first direction DR1 parallel to the upper surface of the substrate 100. The channel supply layer 120 may differ from the channel layer 110 in at least one of polarization characteristics, an energy bandgap, and a lattice constant. For example, the channel supply layer 120 may have at least one of a polarizability and an energy bandgap greater than that of the channel layer 110. The channel supply layer 120 may include one or more materials selected from among nitrides including at least one of aluminum (Al), gallium (Ga), indium (In), and boron (B). For example, the channel supply layer 120 may include at least one of AlGaN, AlInN, InGaN, AlN, and AlInGaN. The channel supply layer 120 may have a single-layer structure or multi-layer structure.

The channel separation pattern 210 may be provided on the channel supply layer 120. The channel separation pattern 210 may increase an energy band of the channel supply layer 120 adjacent thereto. Accordingly, a depletion region 132 may be formed in the 2DEG layer 130 adjacent to the channel separation pattern 210. The depletion region 132 may refer to a region in which the 2DEG layer 130 is not formed. For example, the depletion region 132 may overlap the channel separation pattern 210 in a second direction DR2 perpendicular to the upper surface of the substrate 100. Accordingly, the power semiconductor device 10 may have a normally-off characteristic.

The channel separation pattern 210 may include a III-V series nitride semiconductor. For example, the channel separation pattern 210 may include at least one of GaN, AlGaN, InN, AlInN, InGaN, and AlInGaN. The channel separation pattern 210 may include a p-type semiconductor layer or a layer doped with p-type impurities. For example, the channel separation pattern 210 may include a p-type GaN layer or p-type AlGaN layer doped with a p-type impurity such as magnesium (Mg).

The passivation layer 310 may be provided on the substrate 100 and the channel separation pattern 210. The passivation layer 310 may extend along the surfaces of the substrate 100 and the channel separation pattern 210. The passivation layer 310 may include an insulating material. For example, the passivation layer 310 may include an oxide, a nitride, or a combination thereof. For example, the passivation layer 310 may include at least one of silicon oxide (e.g., $SiO_2$), aluminum oxide (e.g., $Al_2O_3$), hafnium oxide (e.g., $HfO_2$), and silicon nitride ($Si_xN_y$).

A gate hole GH, a source hole SH, and a drain hole DH may be provided in the passivation layer 310. The gate hole GH may penetrate the passivation layer 310 to expose the channel separation pattern 210. A width of the gate hole GH in the first direction DR1 may be less than a width of the channel separation pattern 210 in a first direction.

The source hole SH and the drain hole DH may penetrate the passivation layer 310 to expose the substrate 100. The source hole SH and the drain hole DH may be apart from each other with the gate hole GH therebetween. The drain hole DH may be apart from the source hole SH in the first direction DR1. Although it is illustrated that the source hole SH and the drain hole DH do not penetrate the channel supply layer 120, this is merely an example. In another example, the source hole SH and/or the drain hole DH may penetrate the channel supply layer 120 to expose the channel layer 110.

The gate electrode pattern 410 may be provided on the channel separation pattern 210. The gate electrode pattern 410 may fill the gate hole GH and extend onto the passivation layer 310. A width of the gate electrode pattern 410 in the gate hole GH may be less than the width of the channel separation pattern 210. The width of the gate electrode pattern 410 immediately adjacent to the channel separation pattern 210 may be less than the width of the channel separation pattern 210. For example, a width of the lowermost end of the gate electrode pattern 410 may be less than the width of the channel separation pattern 210. Accordingly, the gate electrode pattern 410 and the channel separation pattern 210 may have a step difference. A structure in which the gate electrode pattern 410 and the channel separation pattern 210 have a step difference may be referred to as a stepped gate structure. Because the gate electrode pattern 410 in the gate hole GH has a width less than that of the channel separation pattern 210, a leakage current flowing along side surfaces of the gate electrode pattern 410 and the channel separation pattern 210 may be reduced, and an electric field may be limited and/or prevented from being concentrated on the side surfaces of the gate electrode pattern 410. The gate electrode pattern 410 may include an electrically conductive material. For example, the gate electrode pattern 410 may include at least one of titanium nitride (TiN), platinum (Pt), palladium (Pd), tungsten (W), titanium (Ti), Al, nickel (Ni), and gold (Au). The gate electrode pattern 410 may have a single-layer structure or multi-layer structure.

The gate electrode pattern 410 may include an electric field relaxation region 410R protruding from the side surfaces of the gate electrode pattern 410 in the gate hole GH in the first direction DR1. The electric field relaxation region 410R may extend along the upper surface of the passivation layer 310. The electric field relaxation region 410R may be arranged closer to the drain electrode pattern 430 than the channel separation pattern 210. A distance between the electric field relaxation region 410R and the drain electrode pattern 430 in the first direction DR1 may be less than a distance between the channel separation pattern 210 and the drain electrode pattern 430 in the first direction DR1. The electric field relaxation region 410R may reduce concentration of an electric field at a junction portion between the gate hole GH and the channel separation pattern 210.

The source electrode pattern 420 and the drain electrode pattern 430 may be apart from each other with the gate electrode pattern 410 therebetween. For example, the drain electrode pattern 430 may be apart from the source electrode pattern 420 in the first direction DR1. The source electrode pattern 420 and the drain electrode pattern 430 may fill the source hole SH and the drain hole DH, respectively, and extend onto the passivation layer 310. The source electrode pattern 420 and the drain electrode pattern 430 may penetrate the passivation layer 310. Although it is illustrated that the source electrode pattern 420 and the drain electrode pattern 430 are apart from the channel layer 110 by the channel supply layer 120, this is merely an example. In another example, the source electrode pattern 420 and/or the drain electrode pattern 430 may penetrate the channel supply layer 120 to be in contact with the channel layer 110. For example, the source electrode pattern 420 and/or the drain electrode pattern 430 penetrating the channel supply layer 120 may extend to a depth in direct contact with the 2DEG layer 130. The source electrode pattern 420 and the drain electrode pattern 430 may be in ohmic contact with the channel supply layer 120. An ohmic contact layer (not shown) may be inserted between the source electrode pattern 420 and the channel supply layer 120 and between the drain electrode pattern 430 and the channel supply layer 120, as necessary. The source electrode pattern 420 and the drain electrode pattern 430 may have a single-layer structure or multi-layer structure. The source electrode pattern 420 and the drain electrode pattern 430 may include substantially the same material as the gate electrode pattern 410. For example, the source electrode pattern 420 and the drain electrode pattern 430 may include at least one of TiN, Pt, Pd, W, Ti, Al, Ni, and Au.

In the disclosure, a leakage current flowing along the side surfaces of the gate electrode pattern 410 and the channel separation pattern 210 may be reduced, and the power semiconductor device 10 may be provided so an electric field is limited and/or prevented from being concentrated on the side surfaces of the gate electrode pattern 410. The disclosure may provide the power semiconductor device 10 in which an electric field is limited and/or prevented from being concentrated on a junction portion between the gate hole GH and the channel separation pattern 210.

FIGS. 3 to 8 are cross-sectional views of the power semiconductor device corresponding to line I-I' of FIG. 1 for describing a method of manufacturing the power semiconductor device of FIGS. 1 and 2.

Figure 3:
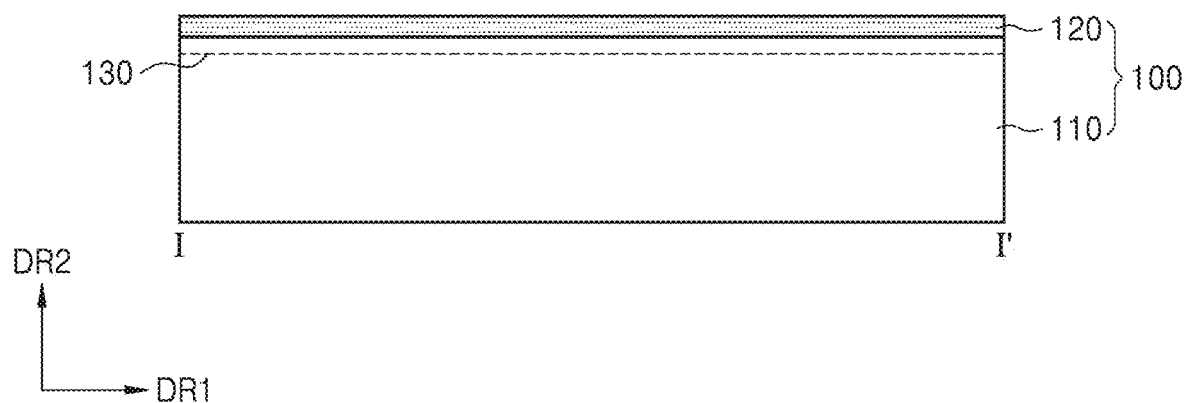
FIGS. 3 to 8 are cross-sectional views of a power semiconductor device corresponding to line I-I' of FIG. 1 for describing a method of manufacturing the power semiconductor device of FIGS. 1 and 2.

Referring to FIG. 3, the channel layer 110 and the channel supply layer 120 may be sequentially stacked. The channel layer 110 and the channel supply layer 120 may constitute the substrate 100. For example, the channel layer 110 and the channel supply layer 120 may be formed on a deposition substrate (e.g., a silicon substrate, a silicon carbide (SiC) substrate, a GaN substrate, a diamond substrate, or a sapphire substrate) by an epitaxial growth process. For example, the epitaxial growth process may include at least one of a metal organic chemical vapor deposition process, a liquid phase epitaxy process, a hydride vapor phase epitaxy process, a molecular beam epitaxy process, or a metal organic vapor phase epitaxy process.

The channel layer 110 may include a III-V series compound semiconductor. For example, the channel layer 110 may include GaN. The channel supply layer 120 may be a semiconductor layer different from the channel layer 110. The channel supply layer 120 may differ from the channel layer 110 in at least one of polarization characteristics, an energy bandgap, and a lattice constant. The channel supply layer 120 may include one or more materials selected from among nitrides including at least one of Al, Ga, In, and B. For example, the channel supply layer 120 may include at least one of AlGaN, AlInN, InGaN, AlN, and AlInGaN. The channel supply layer 120 may have a single-layer structure or multi-layer structure.

The channel supply layer 120 may form the 2DEG layer 130 in the channel layer 110. The 2DEG layer 130 may be formed in the channel layer 110 adjacent to an interface between the channel supply layer 120 and the channel layer 110. The 2DEG layer 130 may extend in the first direction DR1 parallel to the upper surface of the substrate 100.

Figure 4:
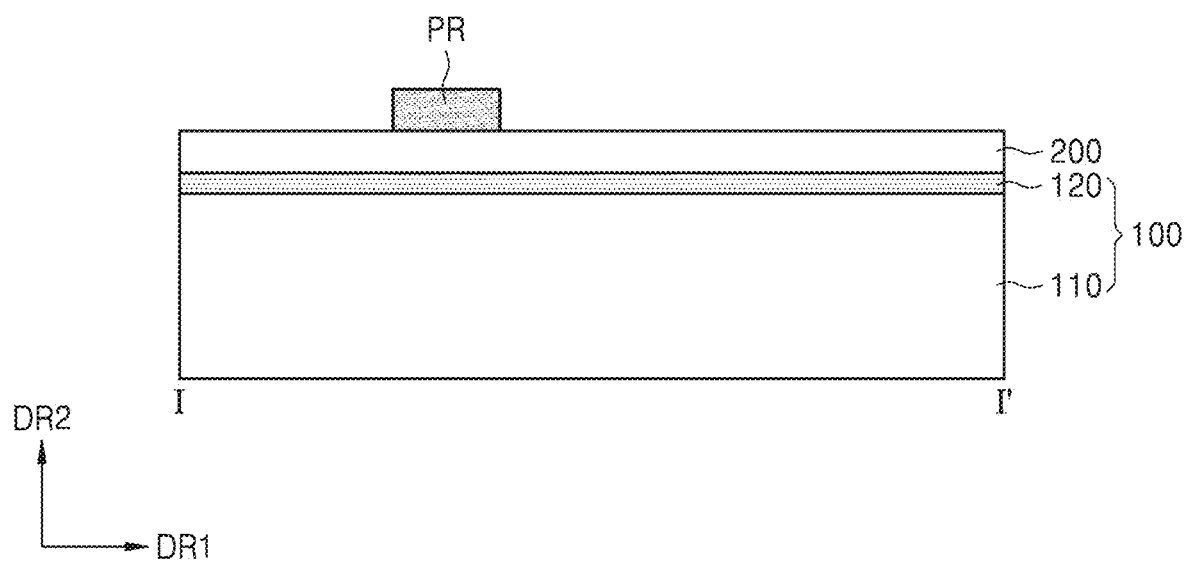

Referring to FIG. 4, a channel separation layer 200 may be formed on the channel supply layer 120. For example, the channel separation layer 200 may be formed on the channel supply layer 120 by the epitaxial growth process. The channel separation layer 200 may include a III-V series compound semiconductor. For example, the channel separation layer 200 may include at least one of GaN, AlGaN, InN, AlInN, InGaN, and AlInGaN. The channel separation layer 200 may include a p-type semiconductor layer or a layer doped with p-type impurities. For example, the channel separation layer 200 may be doped with p-type impurities such as Mg. For example, the channel separation layer 200 may include a p-type GaN layer or a p-type AlGaN layer.

A mask pattern EM may be formed on the channel separation layer 200. For example, the mask pattern EM may include a photoresist pattern.

Figure 5:
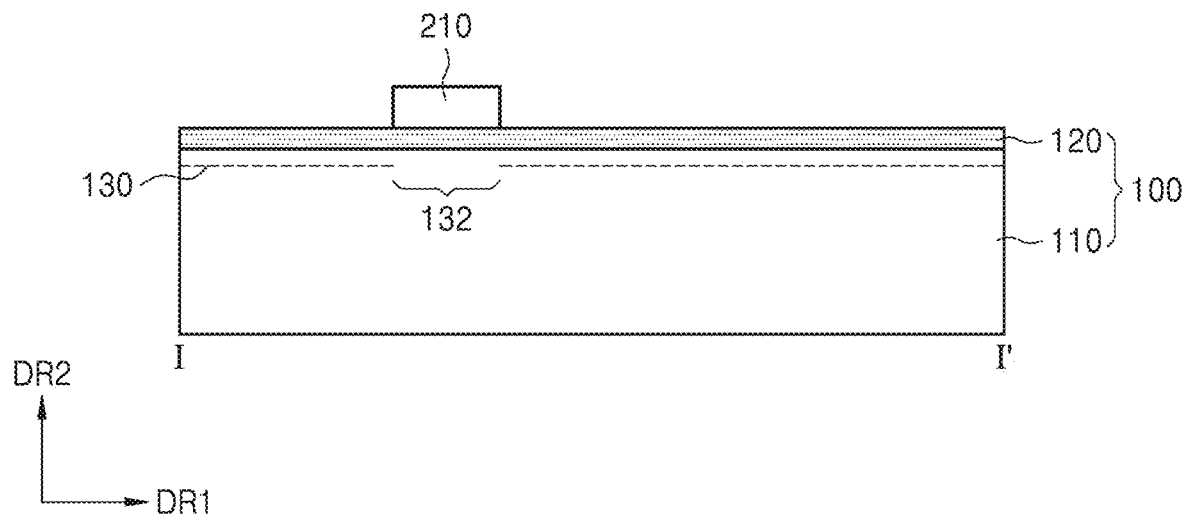

Referring to FIG. 5, the channel separation layer 200 may be patterned by an etching process using the mask pattern EM as an etching mask, so that the channel separation pattern 210 may be formed. The etching process for the channel separation layer 200 may be performed so that the substrate 100 is exposed. The channel separation pattern 210 may increase the energy band of the channel supply layer 120 adjacent thereto. The depletion region 132 in which the 2DEG layer 130 is not generated may be formed in a channel layer adjacent to the channel separation pattern 210. Accordingly, the power semiconductor device 10 may have a normally-off characteristic. The mask pattern EM may be removed during the etching process or after the etching process is completed.

Figure 6:
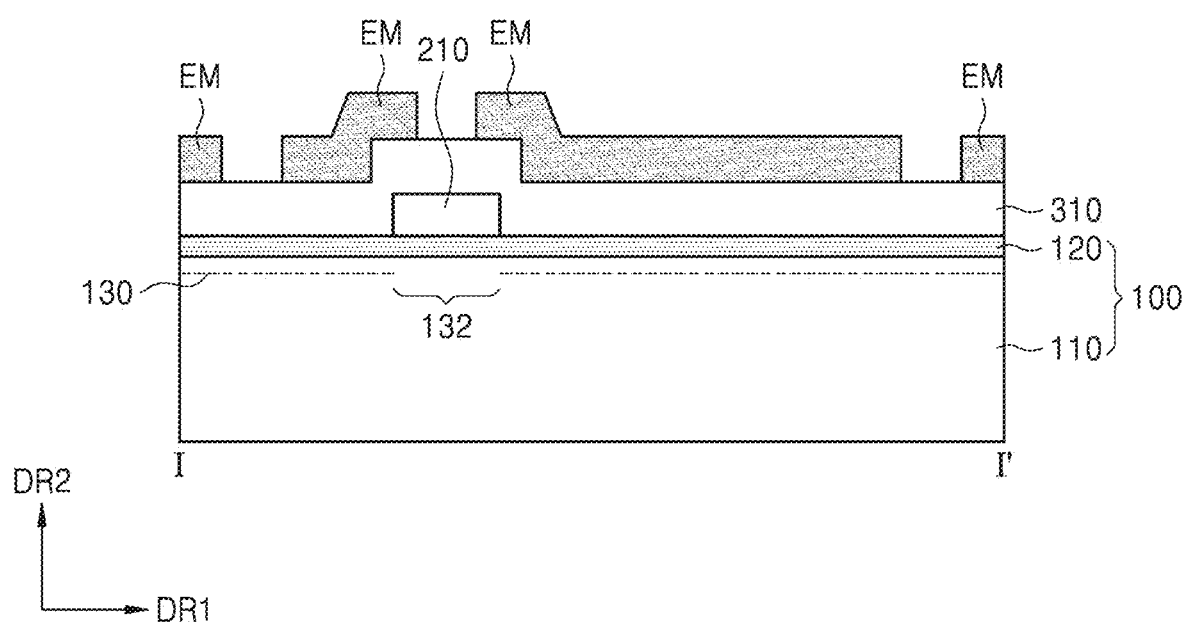

Referring to FIG. 6, the passivation layer 310 may be formed on the substrate 100 and the channel separation pattern 210. A process of forming the passivation layer 310 may include depositing an insulating material on the substrate 100 and the channel separation pattern 210. For example, the passivation layer 310 may be formed by a chemical vapor deposition (CVD) process, a physical vapor deposition (PVD) process, or an atom layer deposition (ALD) process. For example, the passivation layer 310 may include an oxide, a nitride, or a combination thereof. For example, the passivation layer 310 may include at least one of $SiO_2$, $Al_2O_3$, $HfO_2$, and $Si_xN_y$.

A mask pattern EM may be formed on the passivation layer 310 for forming the gate hole GH, the source hole SH, and the drain hole DH. For example, the mask pattern EM may include a photoresist pattern. The mask pattern EM may expose portions of the passivation layer 310 in which the gate hole GH, the source hole SH, and the drain hole DH are to be formed.

Figure 7:
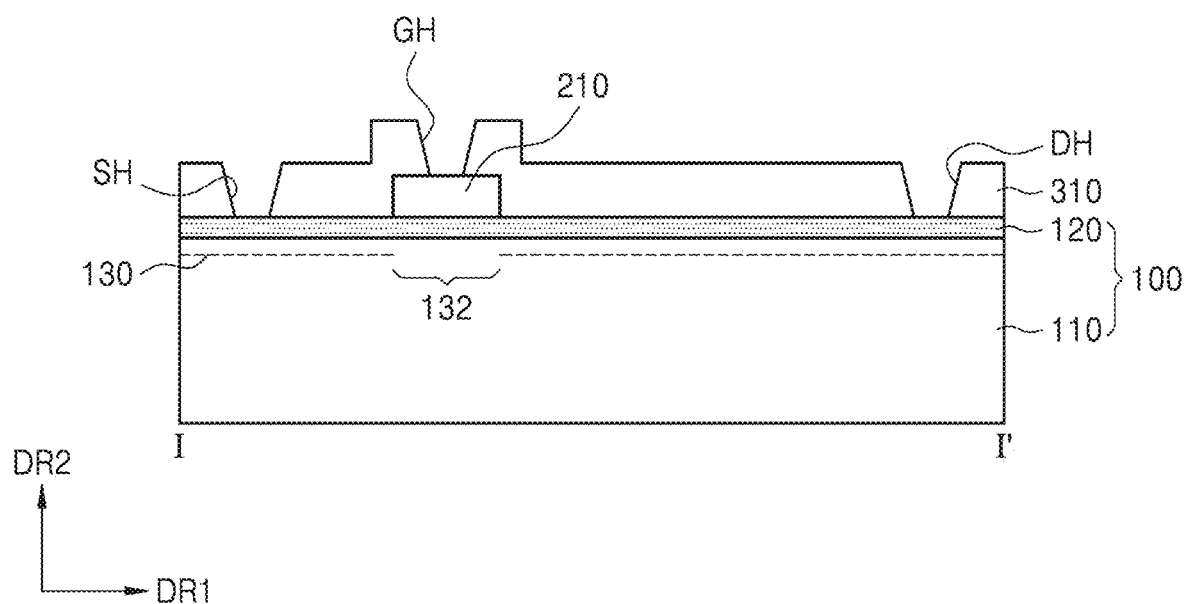

Referring to FIG. 7, the passivation layer 310 may be patterned by an etching process using the mask pattern EM as an etch mask, so that the gate hole GH, the source hole SH, and the drain hole DH may be formed. The etching process may be performed so that the substrate 100 and the channel separation pattern 210 are exposed. The mask pattern EM may be removed during the etching process or after the etching process is completed.

Figure 8:
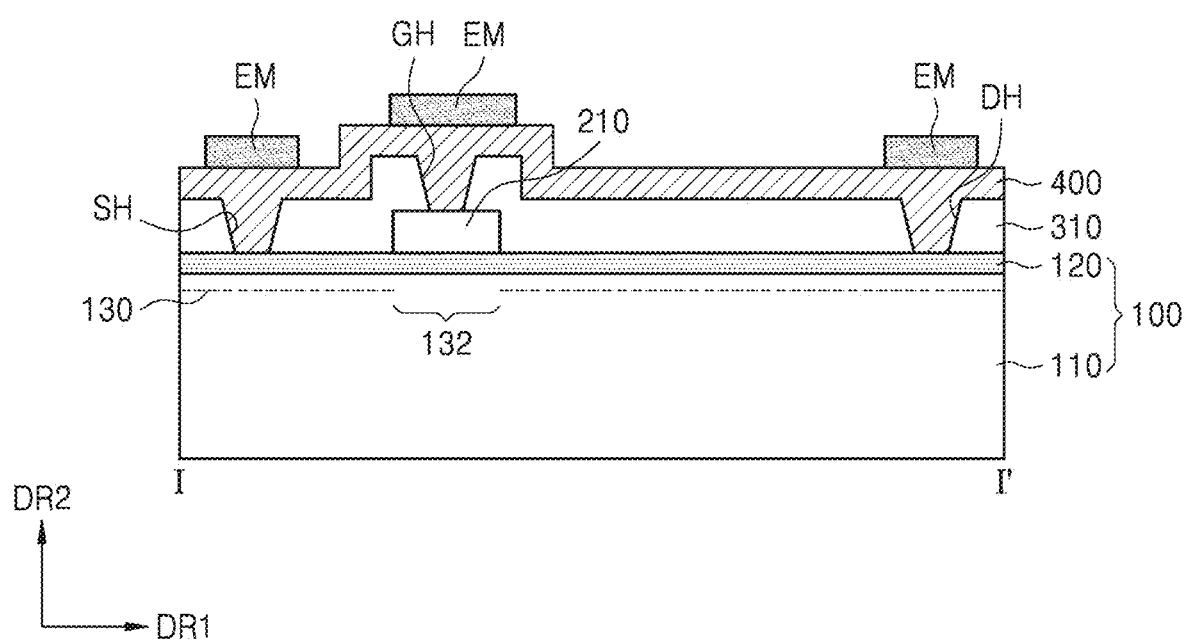

Referring to FIG. 8, a conductive material layer 400 may be formed on the passivation layer 310. The conductive material layer 400 may extend along the passivation layer 310 and may fill the gate hole GH, the source hole SH, and the drain hole DH. Although it is illustrated that the conductive material layer 400 completely fills the gate hole GH, the source hole SH, and the drain hole DH, it is merely an example. In another example, the conductive material layer 400 may partially fill the gate hole GH, the source hole SH, and/or the drain hole DH. The conductive material layer 400 may be in direct contact with the substrate 100 and the channel separation pattern 210. A process of forming the conductive material layer 400 may include depositing an electrically conductive material (e.g., at least one of TiN, Pt, Pd, W, Ti, Al, Ni, and Au) on the passivation layer 310. For example, the conductive material layer 400 may be formed by a CVD process, a PVD process, or an ALD process.

The mask pattern EM may be formed on the conductive material layer 400. For example, the mask pattern EM may include a photoresist pattern. The mask pattern EM may be formed to overlap the gate hole GH, the source hole SH, and the drain hole DH in the second direction DR2.

Referring again to FIG. 2, the conductive material layer 400 may be patterned by an etching process using the mask pattern EM as an etching mask, so that the gate electrode pattern 410, the source electrode pattern 420, and the drain electrode pattern 430 may be formed. The mask pattern EM may be removed during the etching process or after the etching process is completed. Because the gate electrode pattern 410, the source electrode pattern 420, and the drain electrode pattern 430 are formed in the same process step, a process time and a process cost may be reduced as compared with a case where the gate electrode pattern 410, the source electrode pattern 420, and the drain electrode pattern 430 are separately formed.

Figure 9:
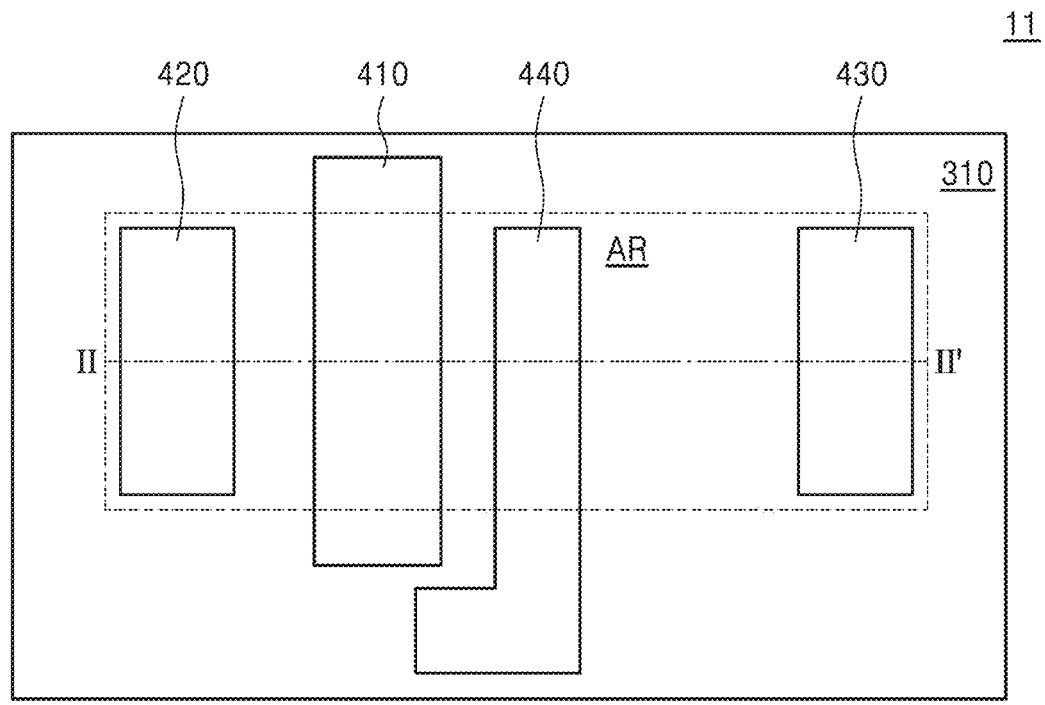
FIG. 9 is a plan view of a power semiconductor device according to an embodiment.
Figure 10:
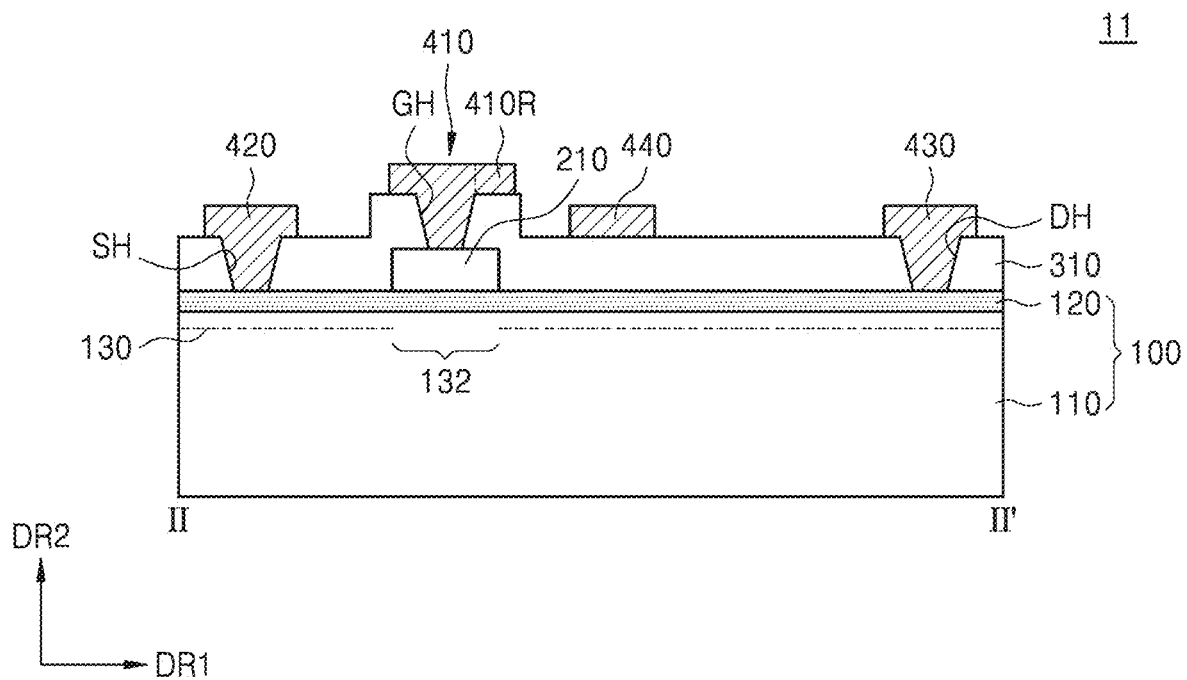
FIG. 10 is a cross-sectional view of a power semiconductor device taken along line II-II' of FIG. 9.

FIG. 9 is a plan view of a power semiconductor device according to an embodiment. FIG. 10 is a cross-sectional view of the power semiconductor device taken along line II-II' of FIG. 9. For brevity of description, descriptions that are substantially the same as those given above with reference to FIGS. 1 and 2 may be omitted.

Referring to FIGS. 9 and 10, a power semiconductor device 11 may be provided. The power semiconductor device 11 may include a substrate 100, a channel separation pattern 210, a gate electrode pattern 410, a passivation layer 310, a source electrode pattern 420, a drain electrode pattern 430, and an electric field relaxation pattern 440. The substrate 100, the channel separation pattern 210, the gate electrode pattern 410, the passivation layer 310, the source electrode pattern 420, and the drain electrode pattern 430 may be substantially the same as those described with reference to FIGS. 1 and 2.

The electric field relaxation pattern 440 may be between the gate electrode pattern 410 and the drain electrode pattern 430. The electric field relaxation pattern 440 may be spaced apart from the gate electrode pattern 410 and the drain electrode pattern 430. The electric field relaxation pattern 440 may be provided on the passivation layer 310. The electric field relaxation pattern 440 may include an electrically conductive material. The electric field relaxation pattern 440 may include substantially the same material as the gate electrode pattern 410, the source electrode pattern 420, and the drain electrode pattern 430. For example, the electric field relaxation pattern 440 may include at least one of TiN, Pt, Pd, W, Ti, Al, Ni, and Au.

When the power semiconductor device 11 operates, a voltage may be applied to the electric field relaxation pattern 440. For example, the voltage applied to the electric field relaxation pattern 440 may be the same as a voltage applied to the source electrode pattern 420. For example, conductive vias and conductive wires may be between the electric field relaxation pattern 440 and the source electrode pattern 420 to electrically connect the electric field relaxation pattern 440 to the source electrode pattern 420.

The electric field relaxation pattern 440 in the disclosure may reduce concentration of an electric field at a junction portion between the gate hole GH and the channel separation pattern 210. Accordingly, the power semiconductor device 11 may have improved electrical characteristics.

Figure 11:
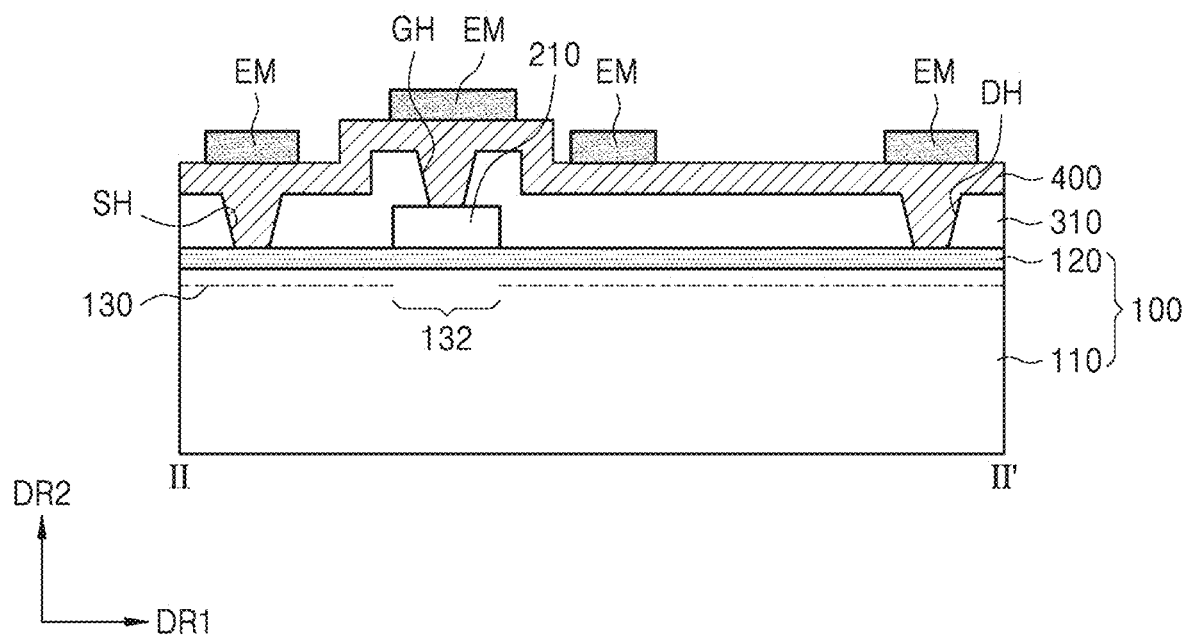
FIG. 11 is a cross-sectional view of a power semiconductor device corresponding to line II-II' of FIG. 9 for describing a method of manufacturing the power semiconductor device of FIGS. 9 and 10.

FIG. 11 is a cross-sectional view of the power semiconductor device corresponding to line II-II' of FIG. 9 for describing a method of manufacturing the power semiconductor device of FIGS. 9 and 10. For brevity of description, descriptions that are substantially the same as those given above with reference to FIGS. 3 through 8 may be omitted.

Referring to FIG. 11, the channel separation pattern 210, the passivation layer 310, the conductive material layer 400, and the mask pattern EM may be formed on the substrate 100 by substantially the same process as that described with reference to FIGS. 3 through 8. However, unlike the example described with reference to FIG. 8, the mask pattern EM may further include a mask pattern EM for generating the electric field relaxation pattern 440 between a pattern formed to overlap the gate hole GH and a pattern formed to overlap the drain hole DH.

Referring again to FIG. 10, the conductive material layer 400 may be patterned by an etching process using the mask pattern EM as an etching mask, so that the gate electrode pattern 410, the source electrode pattern 420, the drain electrode pattern 430, and the electric field relaxation pattern 440 may be formed. The mask pattern EM may be removed during the etching process or after the etching process is completed. Because the gate electrode pattern 410, the source electrode pattern 420, the drain electrode pattern 430, and the electric field relaxation pattern 440 are formed in the same process step, a process time and a process cost may be reduced as compared with a case where the gate electrode pattern 410, the source electrode pattern 420, the drain electrode pattern 430, and the electric field relaxation pattern 440 are separately formed.

Figure 12:
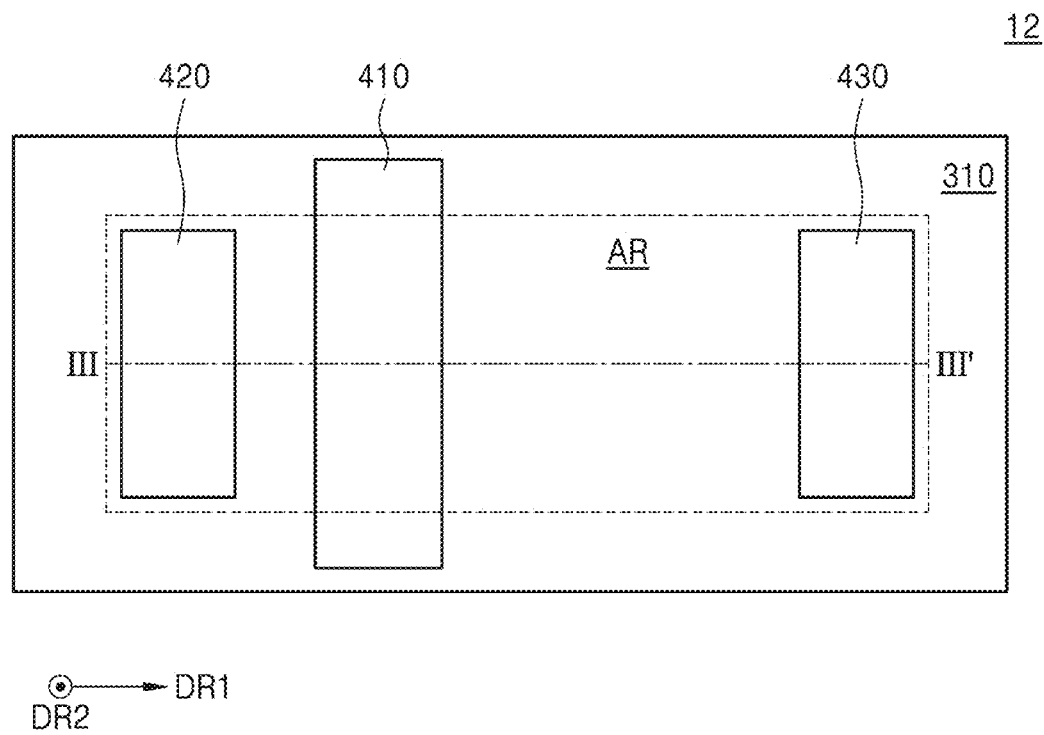
FIG. 12 is a plan view of a power semiconductor device according to an embodiment.
Figure 13:
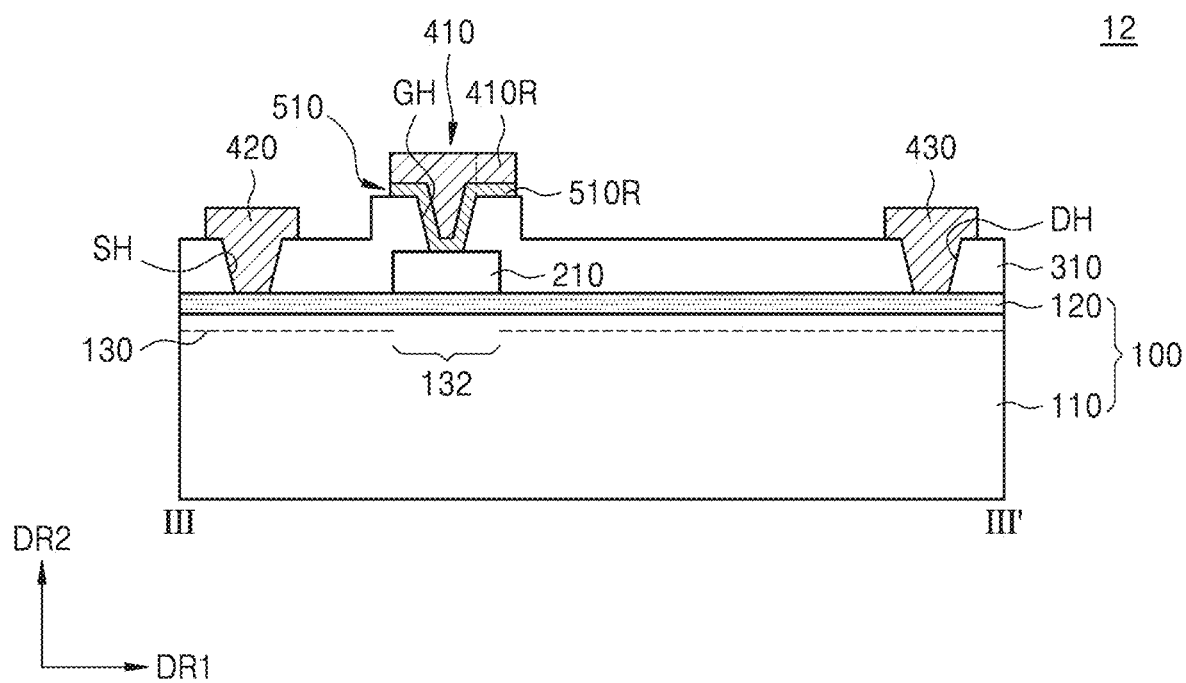
FIG. 13 is a cross-sectional view of a power semiconductor device taken along line III-III' of FIG. 12.

FIG. 12 is a plan view of a power semiconductor device according to an embodiment. FIG. 13 is a cross-sectional view of the power semiconductor device taken along line III-III' of FIG. 12. For brevity of description, descriptions that are substantially the same as those given above with reference to FIGS. 1 and 2 may be omitted.

Referring to FIGS. 12 and 13, a power semiconductor device 12 may be provided. The power semiconductor device 12 may include a substrate 100, a channel separation pattern 210, a Schottky barrier metal pattern 510, a gate electrode pattern 410, a passivation layer 310, a source electrode pattern 420, and a drain electrode pattern 430. The substrate 100, the channel separation pattern 210, the gate electrode pattern 410, the passivation layer 310, the source electrode pattern 420, and the drain electrode pattern 430 may be substantially the same as those described with reference to FIGS. 1 and 2.

The Schottky barrier metal pattern 510 may be between the passivation layer 310 and the gate electrode pattern 410 and between the channel separation pattern 210 and the gate electrode pattern 410. The Schottky barrier metal pattern 510 may be in direct contact with the gate electrode pattern 410. Side surfaces of the Schottky barrier metal pattern 510 on the upper surface of the passivation layer 310 may be coplanar with side surfaces of the gate electrode pattern 410. For example, the side surfaces of the Schottky barrier metal pattern 510 and the side surfaces of the gate electrode pattern 410 may extend in the second direction DR2 on the upper surface of the passivation layer 310.

The Schottky barrier metal pattern 510 may have a high work function. For example, the Schottky barrier metal pattern 510 may include TiN, tantalum nitride (TaN), ruthenium (Ru), Mo, Al, tungsten nitride (WN), zirconium disilicide ($ZrSi_2$), molybdenum disilicide ($MoSi_2$), tantalum silicide ($TaSi_2$), or nickel silicide ($NiSi_2$). A resistance between the Schottky barrier metal pattern 510 and the channel separation pattern 210 may be higher than a resistance between the gate electrode pattern 410 and the channel separation pattern 210.

The disclosure may provide the power semiconductor device 12 having improved electrical characteristics by including the Schottky barrier metal pattern 510 having a Schottky barrier with the channel separation pattern 210.

Figure 14:
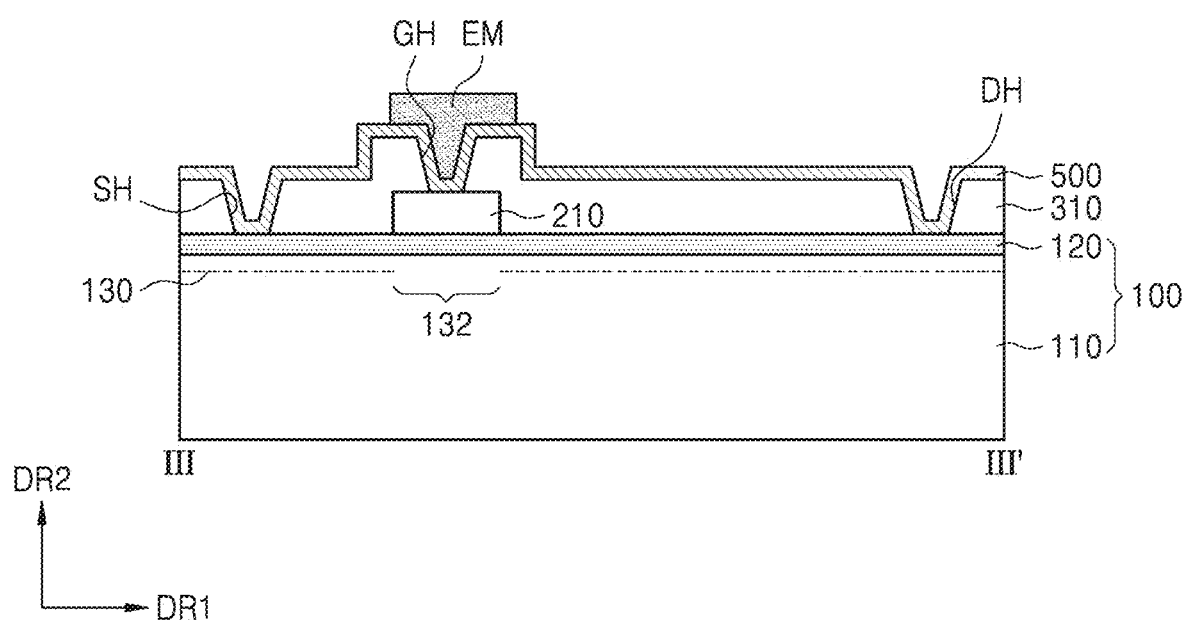
FIGS. 14 to 16 are cross-sectional views of a power semiconductor device corresponding to line III-III' of FIG. 12 for describing a method of manufacturing the power semiconductor device of FIGS. 12 and 13.
Figure 15:
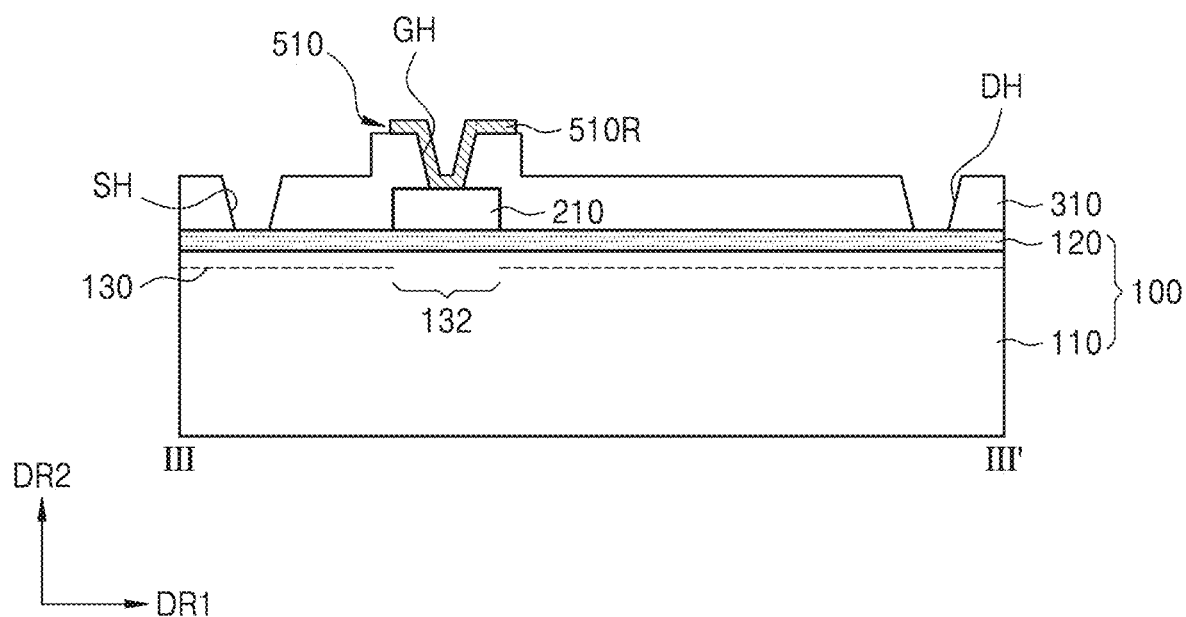
Figure 16:
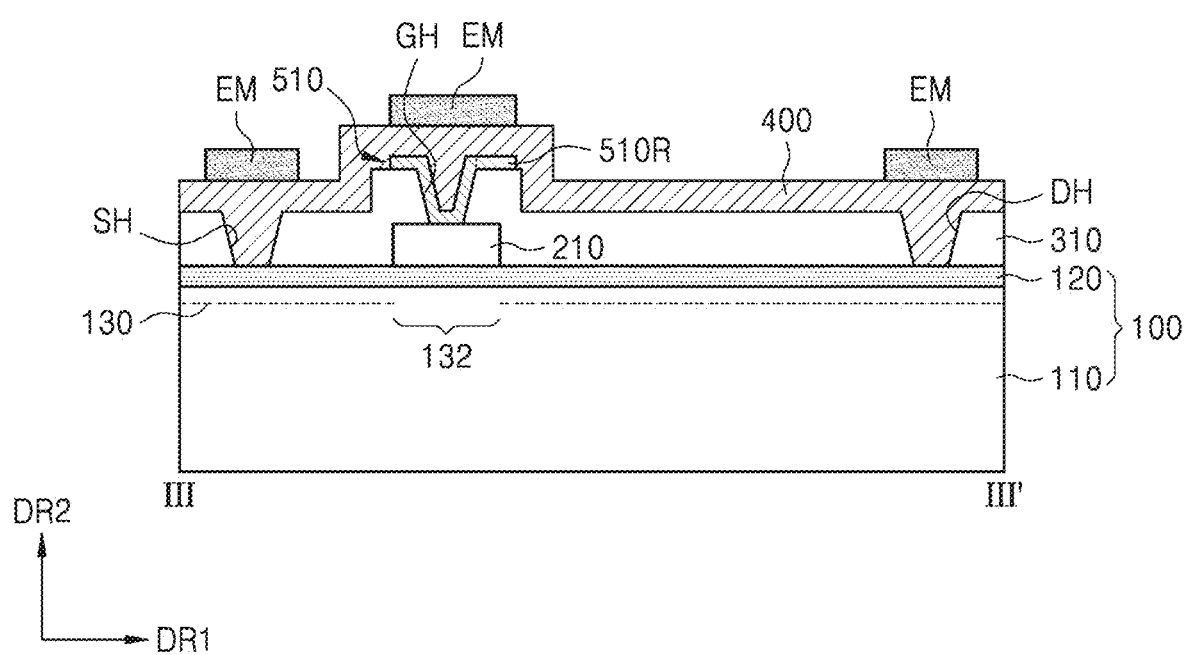

FIGS. 14 to 16 are cross-sectional views of the power semiconductor device corresponding to line III-III' of FIG. 12 for describing a method of manufacturing the power semiconductor device of FIGS. 12 and 13. For brevity of description, descriptions that are substantially the same as those given above with reference to FIGS. 3 through 8 may be omitted.

Referring to FIG. 14, the channel separation pattern 210 and a passivation layer 310 may be formed on the substrate 100 by substantially the same process as that described with reference to FIGS. 3 through 7.

A Schottky barrier metal layer 500 may be formed on the passivation layer 310. The Schottky barrier metal layer 500 may extend along a surface of the passivation layer 310, a surface of the channel separation pattern 210 exposed by the gate hole GH, the source hole SH, and the drain hole DH, and a surface of the substrate 100. The forming of the Schottky barrier metal layer 500 may include depositing a Schottky barrier metal on the passivation layer 310 (e.g., a CVD process, a PVD process, or an ALD process). For example, the Schottky barrier metal may include TiN, TaN, Ru, Mo, Al, WN, $ZrSi_2$, $MoSi_2$, $TaSi_2$, or $NiSi_2$.

The mask pattern EM may be formed on the Schottky barrier metal layer 500. For example, the mask pattern EM may include a photoresist pattern. The mask pattern EM may be formed on the channel separation pattern 210. The mask pattern EM may be formed to overlap the channel separation pattern 210 in the second direction DR2.

Referring to FIG. 15, the Schottky barrier metal layer 500 may be patterned by an etching process using the mask pattern EM as an etch mask, so that the Schottky barrier metal pattern 510 may be formed. The mask pattern EM may be removed during the etching process or after the etching process is completed. The Schottky barrier metal pattern 510 may be substantially the same as that described with reference to FIGS. 12 and 13.

Referring to FIG. 16, the conductive material layer 400 and the mask pattern EM may be formed on the passivation layer 310 and the Schottky barrier metal pattern 510 by substantially the same process as that described with reference to FIG. 8. The conductive material layer 400 may cover the passivation layer 310 and the Schottky barrier metal pattern 510, and may fill the gate hole GH, the source hole SH, and the drain hole DH. Although it is illustrated that the conductive material layer 400 completely fills the gate hole GH, the source hole SH, and the drain hole DH, it is merely an example. In another example, the conductive material layer 400 may partially fill the gate hole GH, the source hole SH, and/or the drain hole DH. The conductive material layer 400 may be in direct contact with the substrate 100 and the Schottky barrier metal pattern 510. The mask pattern EM may completely overlap the Schottky barrier metal pattern 510 in the second direction DR2. For example, the mask pattern EM may be completely included in a region overlapping the Schottky barrier metal pattern 510 in the second direction DR2.

Referring again to FIG. 13, the conductive material layer 400 may be patterned by an etching process using the mask pattern EM as an etching mask, so that the gate electrode pattern 410, the source electrode pattern 420, and the drain electrode pattern 430 may be formed. The mask pattern EM may be removed during the etching process or after the etching process is completed. For example, a portion of the Schottky barrier metal pattern 510 may be etched together during the etching process of the conductive material layer 400. Accordingly, side surfaces of the gate electrode pattern 410 and the Schottky barrier metal pattern 510 may be coplanar on the upper surface of the passivation layer 310.

Figure 17:
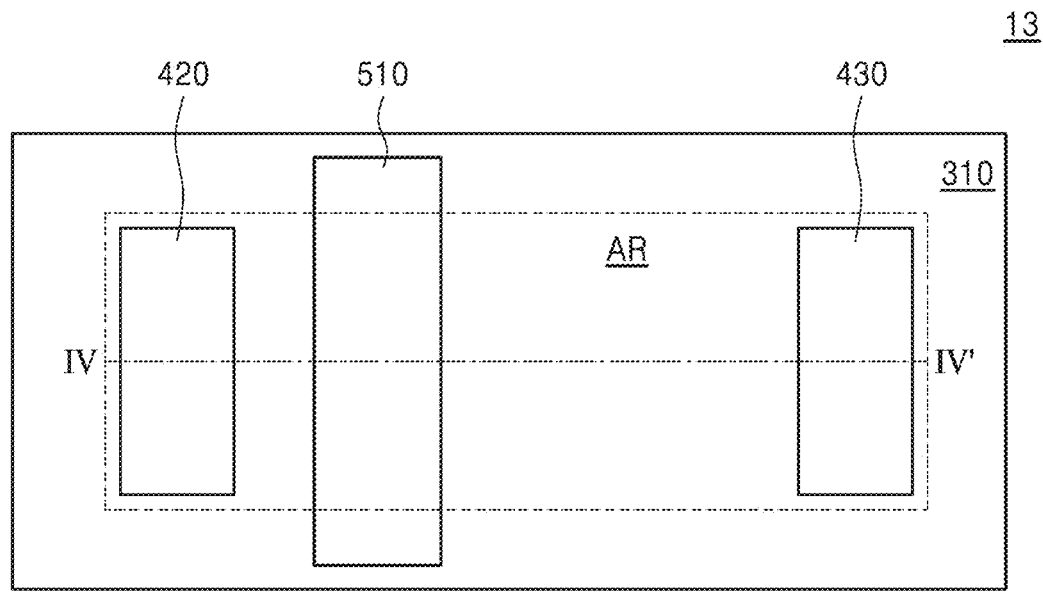
FIG. 17 is a plan view of a power semiconductor device according to an embodiment.
Figure 18:
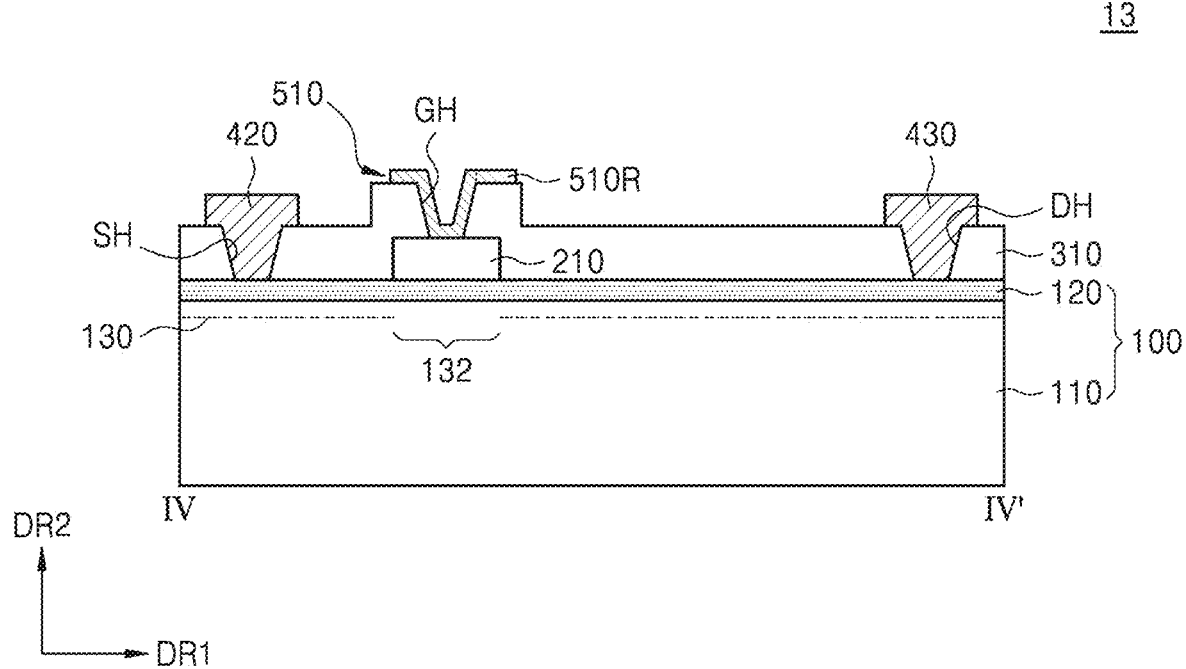
FIG. 18 is a cross-sectional view of a power semiconductor device taken along line IV-IV' of FIG. 17.

FIG. 17 is a plan view of a power semiconductor device according to an embodiment. FIG. 18 is a cross-sectional view of the power semiconductor device taken along line IV-IV' of FIG. 17. For brevity of description, descriptions that are substantially the same as those given above with reference to FIGS. 12 and 13 may be omitted.

Referring to FIGS. 17 and 18, a power semiconductor device 13 may be provided. The power semiconductor device 13 may include other elements except for the gate electrode pattern 410 of the power semiconductor device 12 described with reference to FIGS. 12 and 13. In the power semiconductor device 13, the Schottky barrier metal pattern 510 may have a function of a gate electrode.

The disclosure may provide the power semiconductor device 13 having improved electrical characteristics by including the Schottky barrier metal pattern 510 having a Schottky barrier with the channel separation pattern 210.

Figure 19:
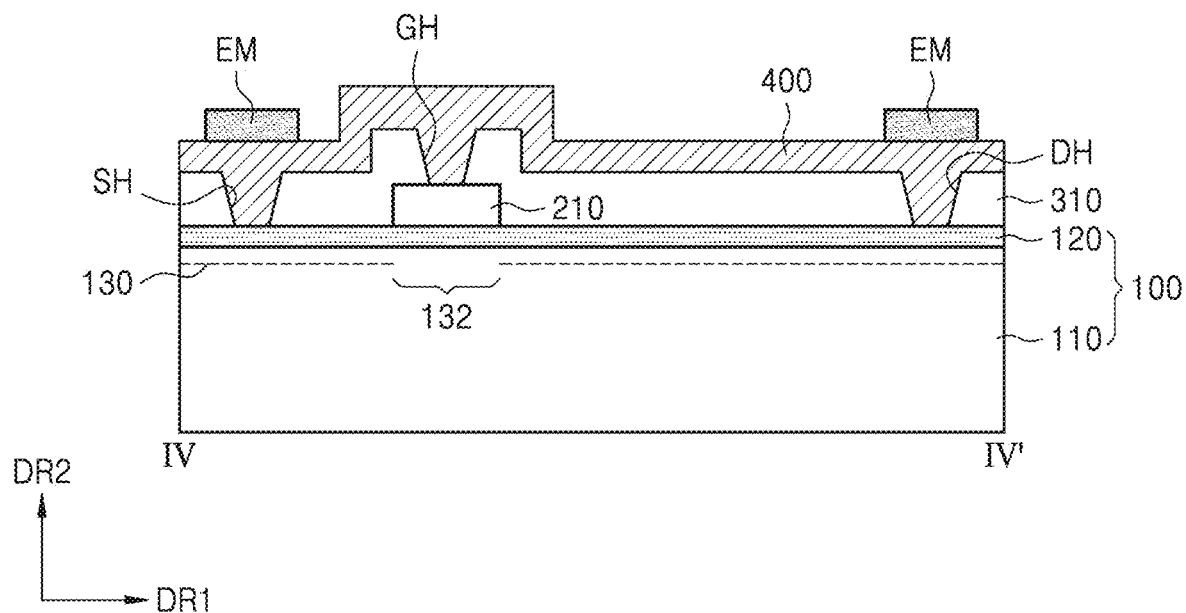
FIGS. 19 to 21 are cross-sectional views of a power semiconductor device corresponding to line IV-IV' of FIG. 17 for describing a method of manufacturing the power semiconductor device of FIGS. 17 and 18.
Figure 20:
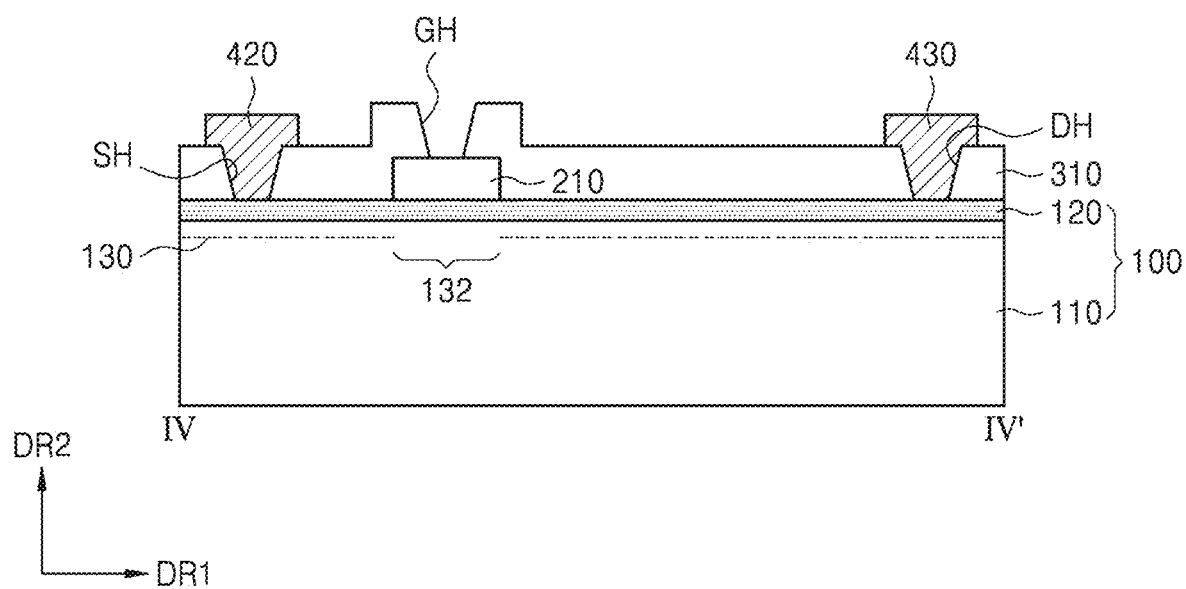
Figure 21:
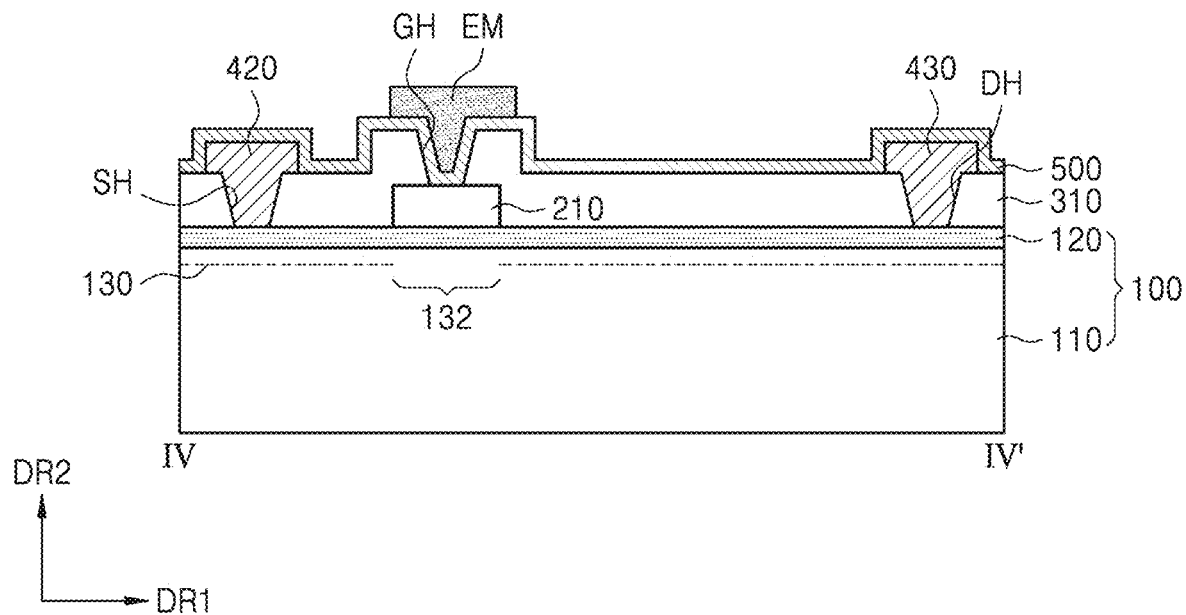

FIGS. 19 to 21 are cross-sectional views of the power semiconductor device corresponding to line IV-IV' of FIG. 17 for describing a method of manufacturing the power semiconductor device of FIGS. 17 and 18. For brevity of description, descriptions that are substantially the same as those given above with reference to FIGS. 3 through 8 and those given above with reference to FIG. 14 may be omitted.

Referring to FIG. 19, the channel separation pattern 210, the passivation layer 310, the conductive material layer 400, and the mask pattern EM may be formed on the substrate 100 by substantially the same process as that described with reference to FIGS. 3 through 8. Unlike the illustration in FIG. 8, the mask pattern EM may not be formed on the gate hole GH.

Referring to FIG. 20, the conductive material layer 400 may be patterned by an etching process using the mask pattern EM as an etching mask, so that the source electrode pattern 420 and the drain electrode pattern 430 may be formed. The mask pattern EM may be removed during the etching process or after the etching process is completed. Because the mask pattern EM is not formed on the gate hole GH, the conductive material layer 400 in the gate hole GH may be removed. The channel separation pattern 210 may be exposed by the gate hole GH.

Referring to FIG. 21, the Schottky barrier metal layer 500 and the mask pattern EM may be formed by substantially the same process as that described with reference to FIG. 14. The Schottky barrier metal layer 500 may extend along the surface of the passivation layer 310 and the surface of the channel separation pattern 210 exposed by the gate hole GH. The mask pattern EM may be provided on the channel separation pattern 210. The mask pattern EM may not be formed on the source electrode pattern 420 and the drain electrode pattern 430.

Referring again to FIG. 18, the Schottky barrier metal layer 500 may be patterned by an etching process using the mask pattern EM as an etching mask, so that the Schottky barrier metal pattern 510 may be formed. The Schottky barrier metal layer 500 on the source electrode pattern 420 and the drain electrode pattern 430 may be removed to expose the source electrode pattern 420 and the drain electrode pattern 430. The mask pattern EM may be removed during the etching process or after the etching process is completed.

Figure 22:
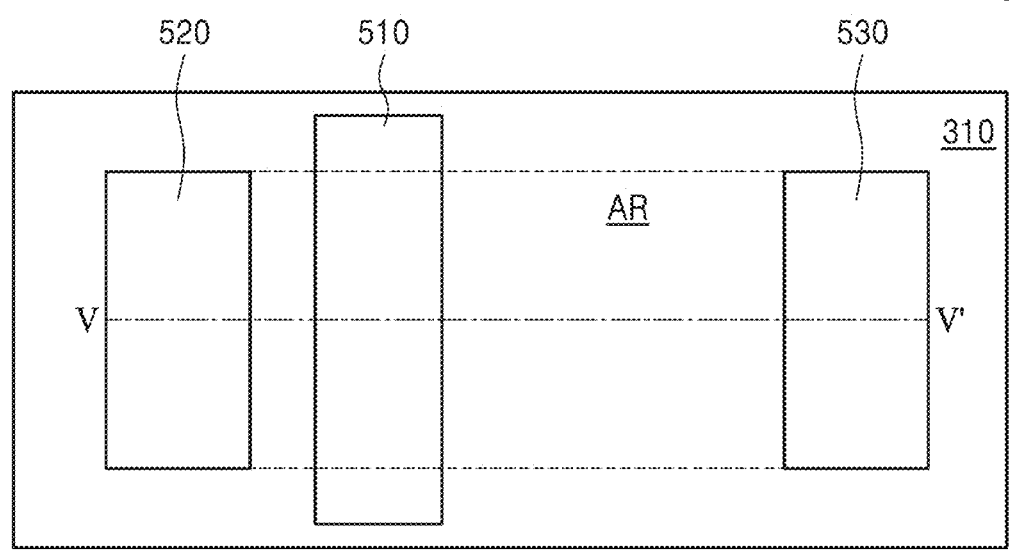
FIG. 22 is a plan view of a power semiconductor device according to an embodiment.
Figure 23:
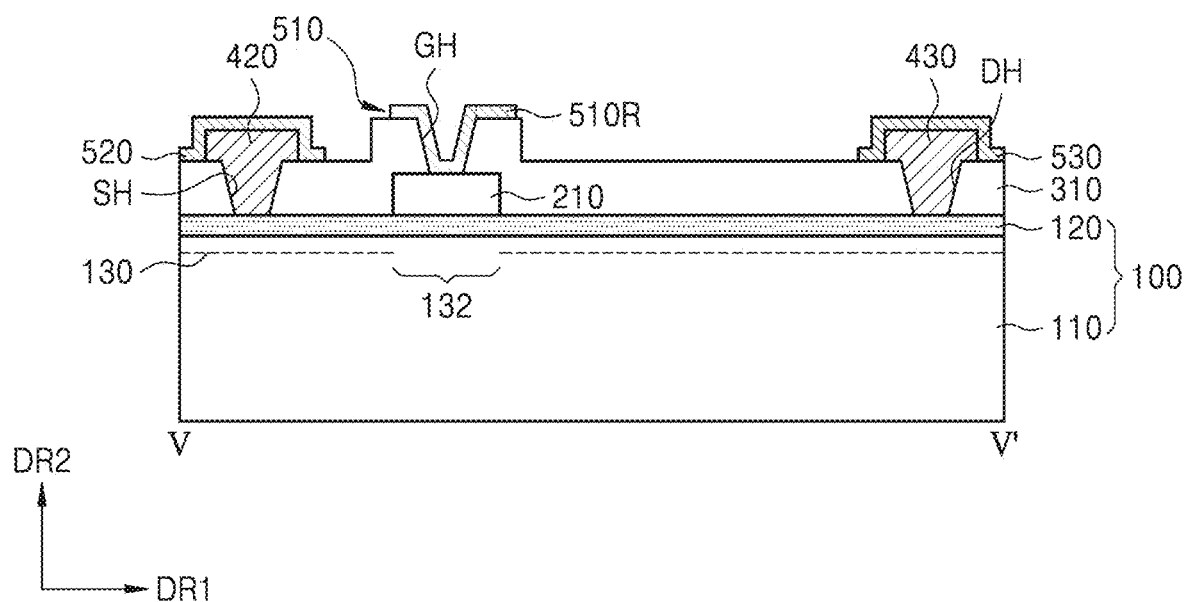
FIG. 23 is a cross-sectional view of a power semiconductor device taken along line V-V' of FIG. 22.

FIG. 22 is a plan view of a power semiconductor device according to an embodiment. FIG. 23 is a cross-sectional view of the power semiconductor device taken along line V-V' of FIG. 22. For brevity of description, descriptions that are substantially the same as those given above with reference to FIGS. 17 and 18 may be omitted.

Referring to FIGS. 22 and 23, a power semiconductor device 14 may be provided. The power semiconductor device 14 may include all elements of the power semiconductor device 13 described with reference to FIGS. 17 and 18, and may further include an additional source electrode pattern 520 and an additional drain electrode pattern 530.

The additional source electrode pattern 520 may be provided on the source electrode pattern 420. The additional source electrode pattern 520 may completely cover the upper surface and side surfaces of the source electrode pattern 420. The additional source electrode pattern 520 may extend from the source electrode pattern 420 onto the passivation layer 310.

The additional drain electrode pattern 530 may be provided on the drain electrode pattern 430. The additional drain electrode pattern 530 may completely cover the upper surface and side surfaces of the drain electrode pattern 430. The additional drain electrode pattern 530 may extend from the drain electrode pattern 430 onto the passivation layer 310.

Figure 24:
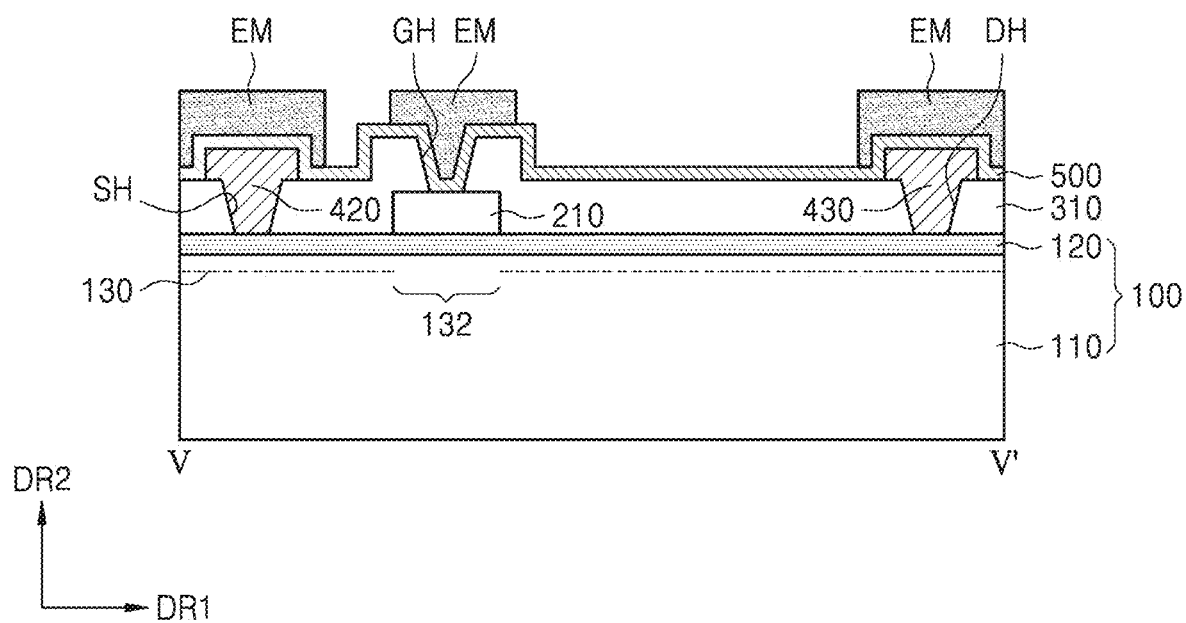
FIG. 24 is a cross-sectional view of a power semiconductor device corresponding to line V-V' of FIG. 22 for describing a method of manufacturing the power semiconductor device of FIGS. 22 and 23.

FIG. 24 is a cross-sectional view of the power semiconductor device corresponding to line V-V' of FIG. 22 for describing a method of manufacturing the power semiconductor device of FIGS. 22 and 23. For brevity of description, descriptions that are substantially the same as those given above with reference to FIGS. 19 through 21 may be omitted.

Referring to FIG. 24, the channel separation pattern 210, the passivation layer 310, the source electrode pattern 420, the drain electrode pattern 430, the Schottky barrier metal layer 500, and the mask pattern EM may be formed on the substrate 100 by substantially the same process as that described with reference to FIGS. 19 to 21. Unlike the illustration in FIG. 21, the mask pattern EM may be formed on the channel separation pattern 210, the source electrode pattern 420, and the drain electrode pattern 430. The mask pattern EM on the source electrode pattern 420 and the drain electrode pattern 430 may completely cover the source electrode pattern 420 and the drain electrode pattern 430. The mask pattern EM on the source electrode pattern 420 may extend from the upper surface of the source electrode pattern 420 to side surfaces thereof. The mask pattern EM on the drain electrode pattern 430 may extend from the upper surface of the drain electrode pattern 430 to side surfaces thereof.

Referring again to FIG. 23, the Schottky barrier metal layer 500 may be patterned by an etching process using the mask pattern EM as an etching mask, so that the Schottky barrier metal pattern 510, the additional source electrode pattern 520, and the additional drain electrode pattern 530 may be formed. The Schottky barrier metal pattern 510, the additional source electrode pattern 520, and the additional drain electrode pattern 530 may be substantially the same as those described with reference to FIGS. 22 and 23. The mask pattern EM may be removed during the etching process or after the etching process is completed.

Figure 25:
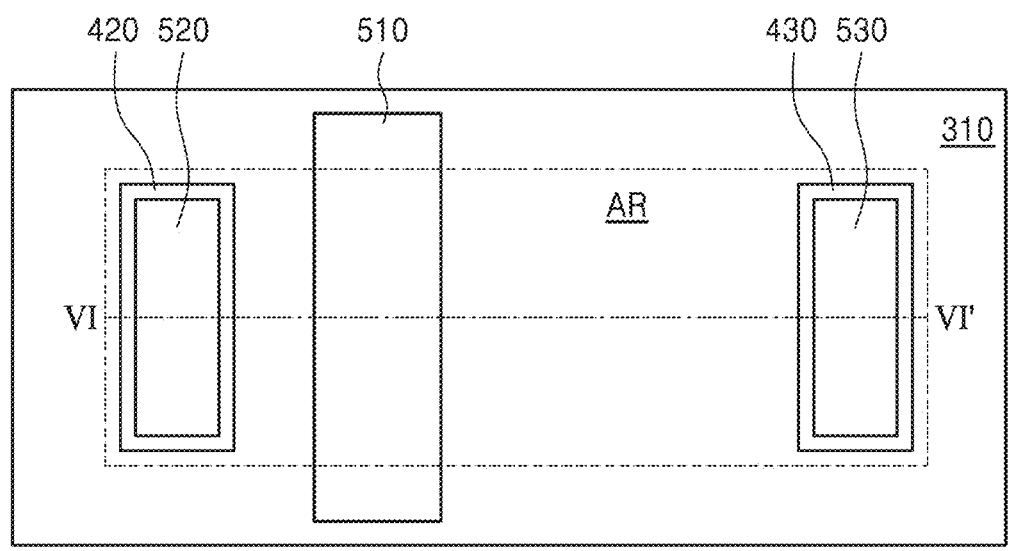
FIG. 25 is a plan view of a power semiconductor device according to an embodiment.
Figure 26:
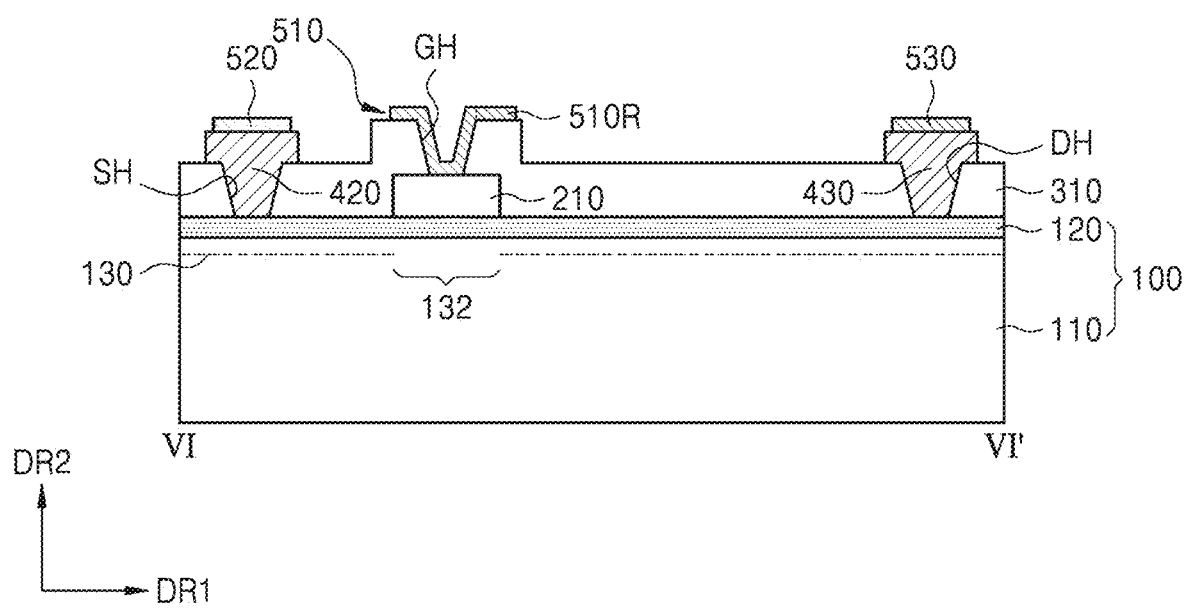
FIG. 26 is a cross-sectional view of a power semiconductor device taken along line VI-VI' of FIG. 25.

FIG. 25 is a plan view of a power semiconductor device according to an embodiment. FIG. 26 is a cross-sectional view of the power semiconductor device taken along line VI-VI' of FIG. 25. For brevity of description, descriptions that are substantially the same as those given above with reference to FIGS. 22 and 23 may be omitted.

Referring to FIGS. 25 and 26, a power semiconductor device 15 may be provided. The power semiconductor device 15 may be substantially the same as the power semiconductor device 14 described with reference to FIGS. 22 and 23, except for the shapes of the additional source electrode pattern 520 and the additional drain electrode pattern 530.

Unlike the description given with reference to FIGS. 22 and 23, the additional source electrode pattern 520 may not be provided on the side surfaces of the source electrode pattern 420. The additional source electrode pattern 520 may be provided on the upper surface of the source electrode pattern 420. Although it is illustrated in FIG. 25 that the additional source electrode pattern 520 is smaller than the source electrode pattern 420, this is merely an example. In another example, the additional source electrode pattern 520 and the source electrode pattern 420 may completely overlap each other. In other words, the upper surfaces of the additional source electrode pattern 520 and the source electrode pattern 420 may have the same area. The source electrode pattern 420 may be exposed between the additional source electrode pattern 520 and the passivation layer 310.

Unlike the description given with reference to FIGS. 22 and 23, the additional drain electrode pattern 530 may not be provided on the side surfaces of the drain electrode pattern 430. The additional drain electrode pattern 530 may be provided on the upper surface of the drain electrode pattern 430. Although it is illustrated in FIG. 25 that the additional drain electrode pattern 530 is smaller than the drain electrode pattern 430, this is merely an example. In another example, the additional drain electrode pattern 530 and the drain electrode pattern 430 may completely overlap each other. In other words, the upper surfaces of the additional drain electrode pattern 530 and the drain electrode pattern 430 may have the same area. The drain electrode pattern 430 may be exposed between the additional drain electrode pattern 530 and the passivation layer 310.

Figure 27:
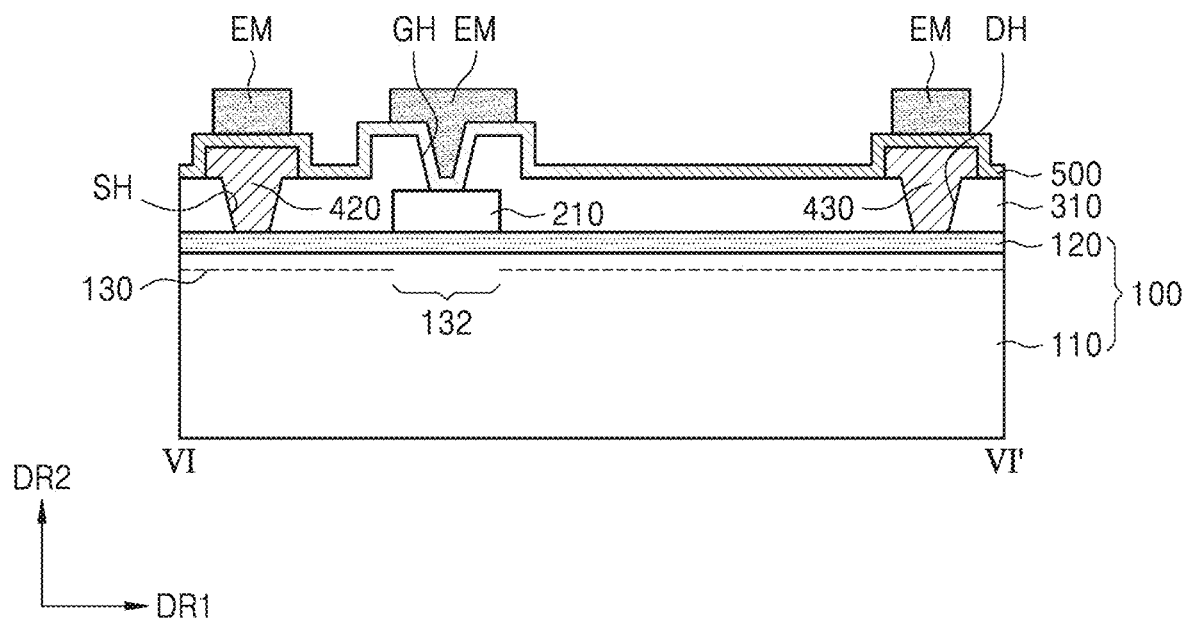
FIG. 27 is a cross-sectional view of a power semiconductor device corresponding to line VI-VI' of FIG. 25 for describing a method of manufacturing the power semiconductor device of FIGS. 25 and 26.

FIG. 27 is a cross-sectional view of the power semiconductor device corresponding to line VI-VI' of FIG. 25 for describing a method of manufacturing the power semiconductor device of FIGS. 25 and 26. For brevity of description, descriptions that are substantially the same as those given above with reference to FIG. 24 may be omitted.

Referring to FIG. 27, the channel separation pattern 210, the passivation layer 310, the source electrode pattern 420, the drain electrode pattern 430, the Schottky barrier metal layer 500, and the mask pattern EM may be formed on the substrate 100 by substantially the same process as that described with reference to FIG. 24. Unlike the illustration in FIG. 24, the mask pattern EM may be formed not to completely cover the source electrode pattern 420 and the drain electrode pattern 430. The mask pattern EM may be formed on the upper surfaces of the source electrode pattern 420 and the drain electrode pattern 430. The mask pattern EM may not be formed on the side surfaces of the source electrode pattern 420 and the drain electrode pattern 430.

Referring again to FIG. 26, the Schottky barrier metal layer 500 may be patterned by an etching process using the mask pattern EM as an etching mask, so that the Schottky barrier metal pattern 510, the additional source electrode pattern 520, and the additional drain electrode pattern 530 may be formed. The Schottky barrier metal pattern 510, the additional source electrode pattern 520, and the additional drain electrode pattern 530 may be substantially the same as those described with reference to FIGS. 22 and 23. The mask pattern EM may be removed during the etching process or after the etching process is completed.

Figure 28:
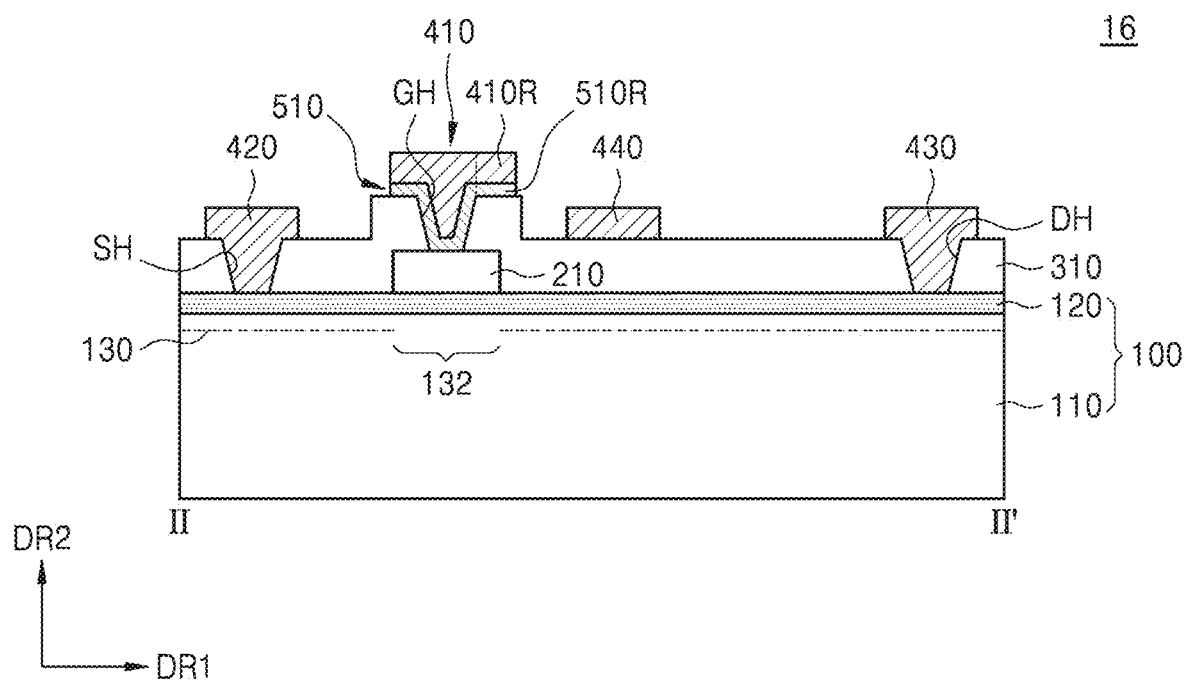
FIG. 28 is a cross-sectional view of a power semiconductor device corresponding to line II-II' of FIG. 9 for describing the power semiconductor device, according to an embodiment.

FIG. 28 is a cross-sectional view of a power semiconductor device corresponding to line II-II' of FIG. 9 for describing the power semiconductor device, according to an embodiment. For brevity of description, descriptions that are substantially the same as those given above with reference to FIGS. 12 and 13 and those given with reference to FIGS. 9 and 10 may be omitted.

Referring to FIG. 28, a power semiconductor device 16 may be provided. The power semiconductor device 16 may include a substrate 100, a channel separation pattern 210, a Schottky barrier metal pattern 510, a gate electrode pattern 410, a passivation layer 310, a source electrode pattern 420, a drain electrode pattern 430, and an electric field relaxation pattern 440.

The substrate 100, the channel separation pattern 210, the gate electrode pattern 410, the passivation layer 310, the source electrode pattern 420, the drain electrode pattern 430, and the electric field relaxation pattern 440 may be substantially the same as those described with reference to FIGS. 9 and 10.

The electric field relaxation pattern 440 may be substantially the same as that described with reference to FIGS. 12 and 13, except for the location of the electric field relaxation pattern 440 with respect to the Schottky barrier metal pattern 510.

The electric field relaxation pattern 440 may be between the Schottky barrier metal pattern 510 and the drain electrode pattern 430. The electric field relaxation pattern 440 may be spaced apart from the Schottky barrier metal pattern 510 and the drain electrode pattern 430.

When the power semiconductor device 16 operates, a voltage may be applied to the electric field relaxation pattern 440. For example, the voltage applied to the electric field relaxation pattern 440 may be the same as a voltage applied to the source electrode pattern 420. For example, conductive vias and conductive wires may be between the electric field relaxation pattern 440 and the source electrode pattern 420 to electrically connect the electric field relaxation pattern 440 to the source electrode pattern 420.

The electric field relaxation pattern 440 in the disclosure may reduce concentration of an electric field at a junction portion between the gate hole GH and the channel separation pattern 210. Accordingly, the power semiconductor device 16 having improved electrical characteristics may be provided.

Figure 29:
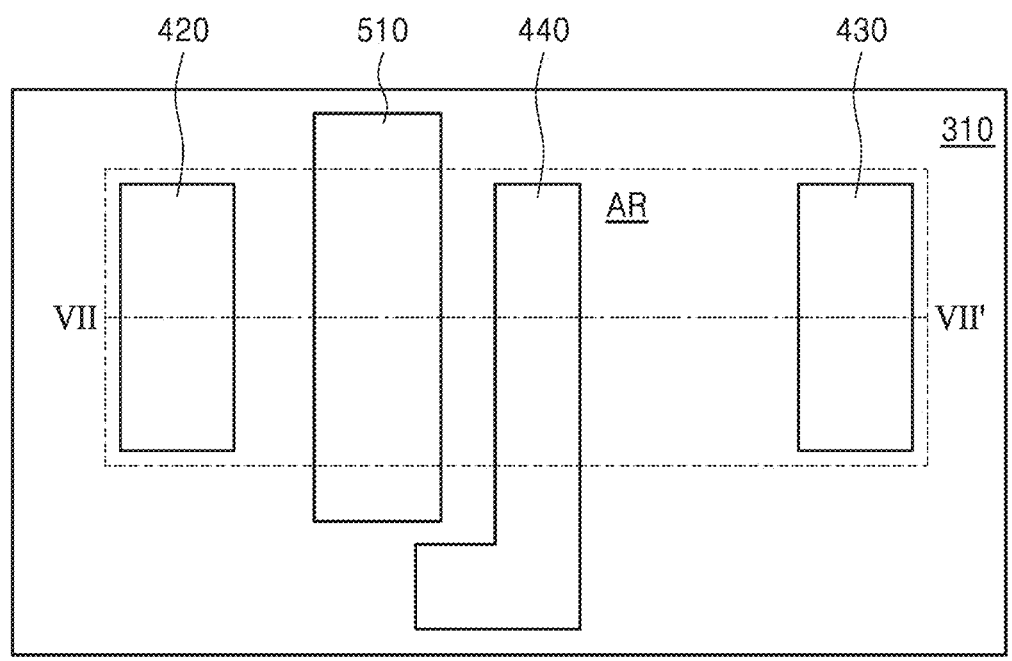
FIG. 29 is a plan view of a power semiconductor device according to an embodiment.
Figure 30:
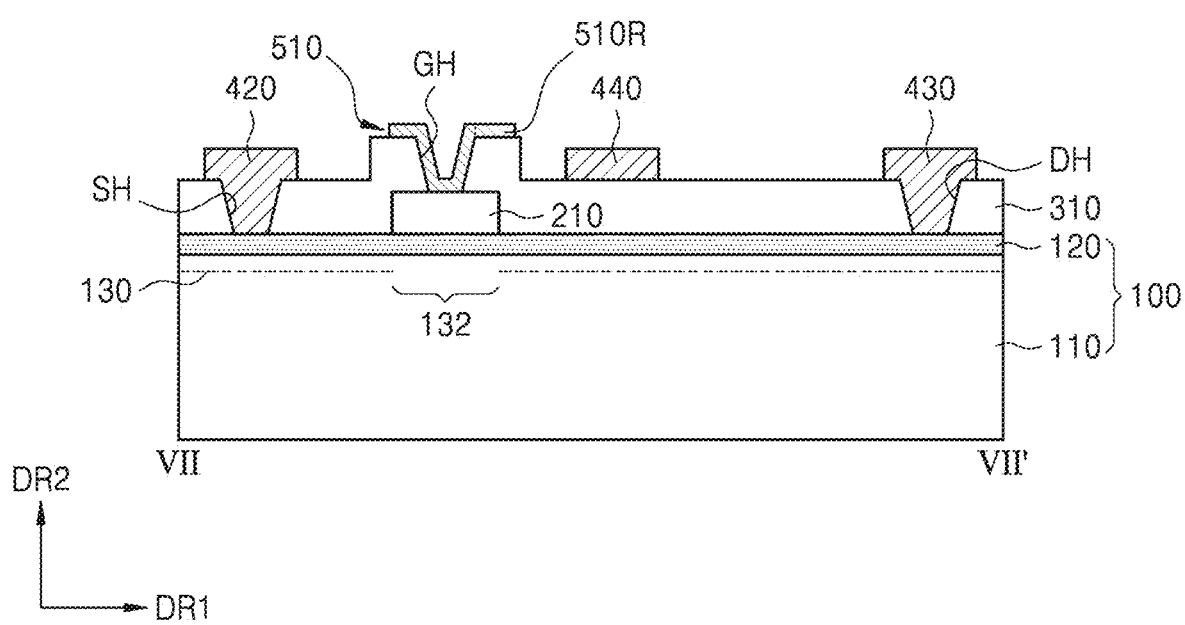
FIG. 30 is a cross-sectional view of a power semiconductor device taken along line VII-VII' of FIG. 29.

FIG. 29 is a plan view of a power semiconductor device according to an embodiment. FIG. 30 is a cross-sectional view of the power semiconductor device taken along line VII-VII' of FIG. 29. For brevity of description, descriptions that are substantially the same as those given above with reference to FIG. 28 may be omitted.

Referring to FIGS. 29 and 30, a power semiconductor device 17 may be provided. The power semiconductor device 17 may include other elements except for the gate electrode pattern 410, among the elements of the power semiconductor device 16 described with reference to FIG. 28. In the power semiconductor device 17, the Schottky barrier metal pattern 510 may have a function of a gate electrode.

The disclosure may provide the power semiconductor device 17 having improved electrical characteristics by including the Schottky barrier metal pattern 510 having a Schottky barrier with the channel separation pattern 210.

Figure 31:
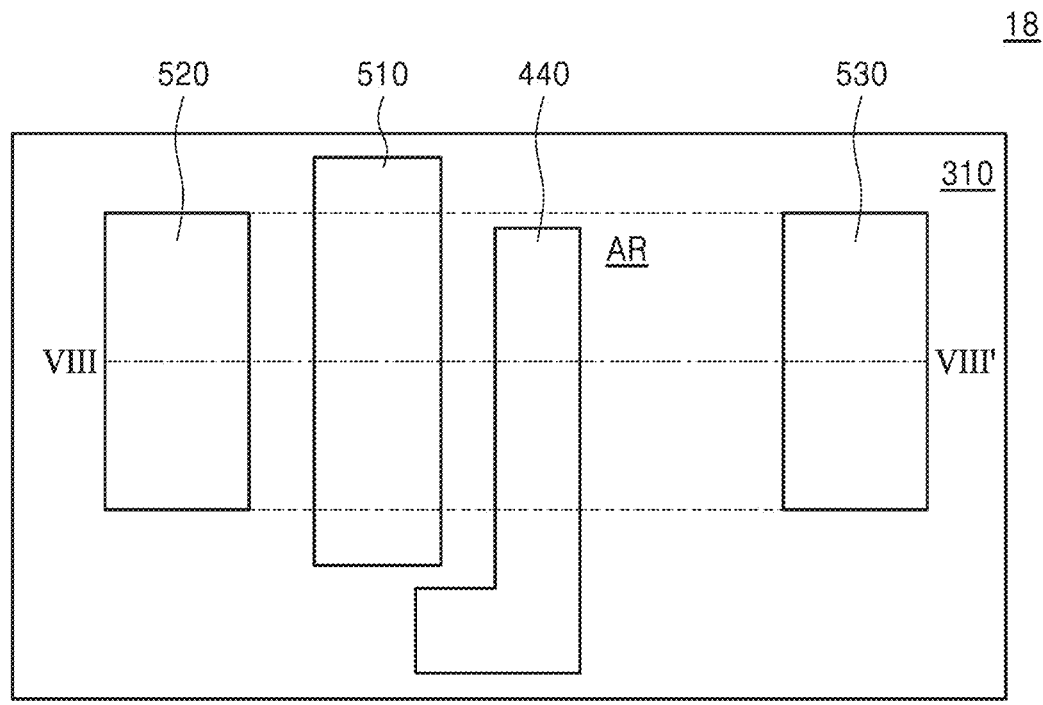
FIG. 31 is a plan view of a power semiconductor device according to an embodiment.
Figure 32:
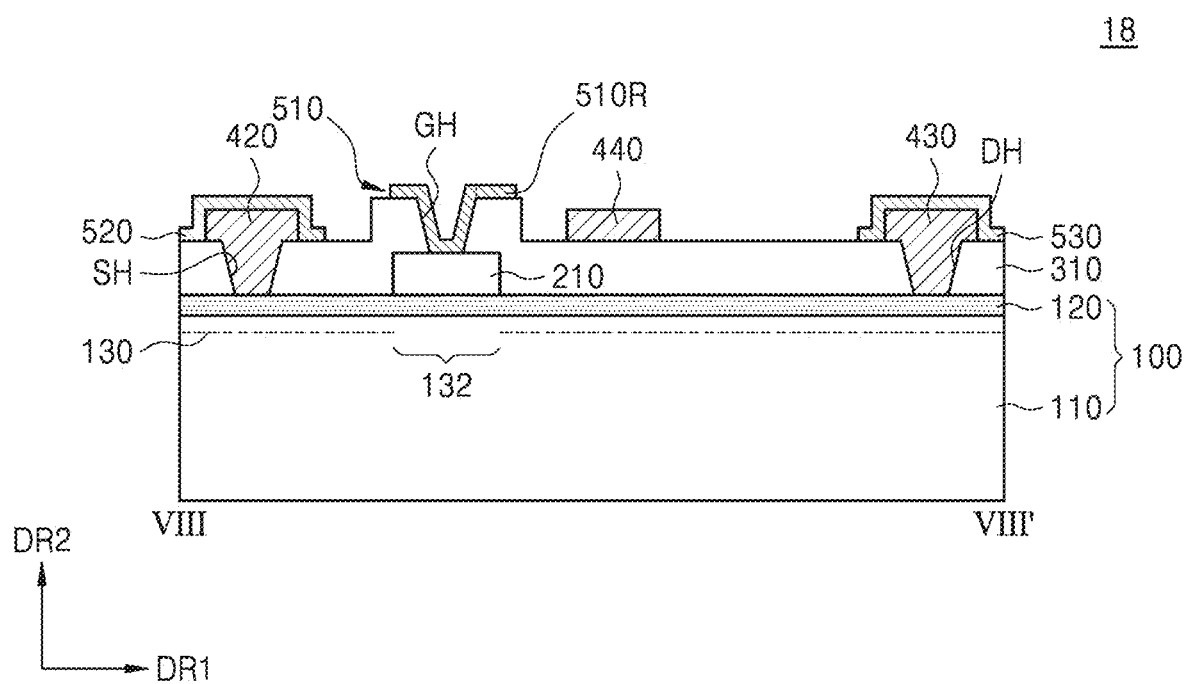
FIG. 32 is a cross-sectional view of a power semiconductor device taken along line VIII-VIII' of FIG. 31.

FIG. 31 is a plan view of a power semiconductor device according to an embodiment. FIG. 32 is a cross-sectional view of the power semiconductor device taken along line VIII-VIII' of FIG. 31. For brevity of description, descriptions that are substantially the same as those given above with reference to FIGS. 29 and 30 may be omitted.

Referring to FIGS. 31 and 32, a power semiconductor device 18 may be provided. The power semiconductor device 18 may include all elements of the power semiconductor device 17 described with reference to FIGS. 29 and 30, and may further include an additional source electrode pattern 520 and an additional drain electrode pattern 530.

The additional source electrode pattern 520 may be provided on the source electrode pattern 420. The additional source electrode pattern 520 may completely cover the upper surface and side surfaces of the source electrode pattern 420. The additional source electrode pattern 520 may extend from the source electrode pattern 420 onto the passivation layer 310.

The additional drain electrode pattern 530 may be provided on the drain electrode pattern 430. The additional drain electrode pattern 530 may completely cover the upper surface and side surfaces of the drain electrode pattern 430. The additional drain electrode pattern 530 may extend from the drain electrode pattern 430 onto the passivation layer 310. The additional drain electrode pattern 530 may be spaced apart from the electric field relaxation pattern 440. The electric field relaxation pattern 440 may be between the additional drain electrode pattern 530 and the Schottky barrier metal pattern 510.

The disclosure may provide the power semiconductor device 18 having improved electrical characteristics.

Figure 33:
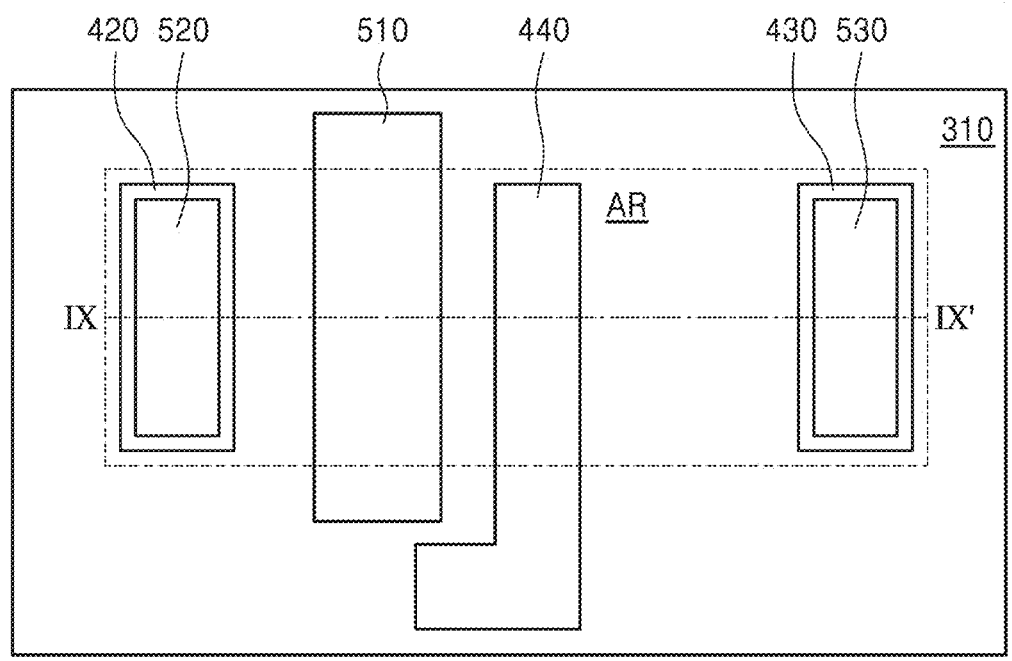
FIG. 33 is a plan view of a power semiconductor device according to an embodiment.
Figure 34:
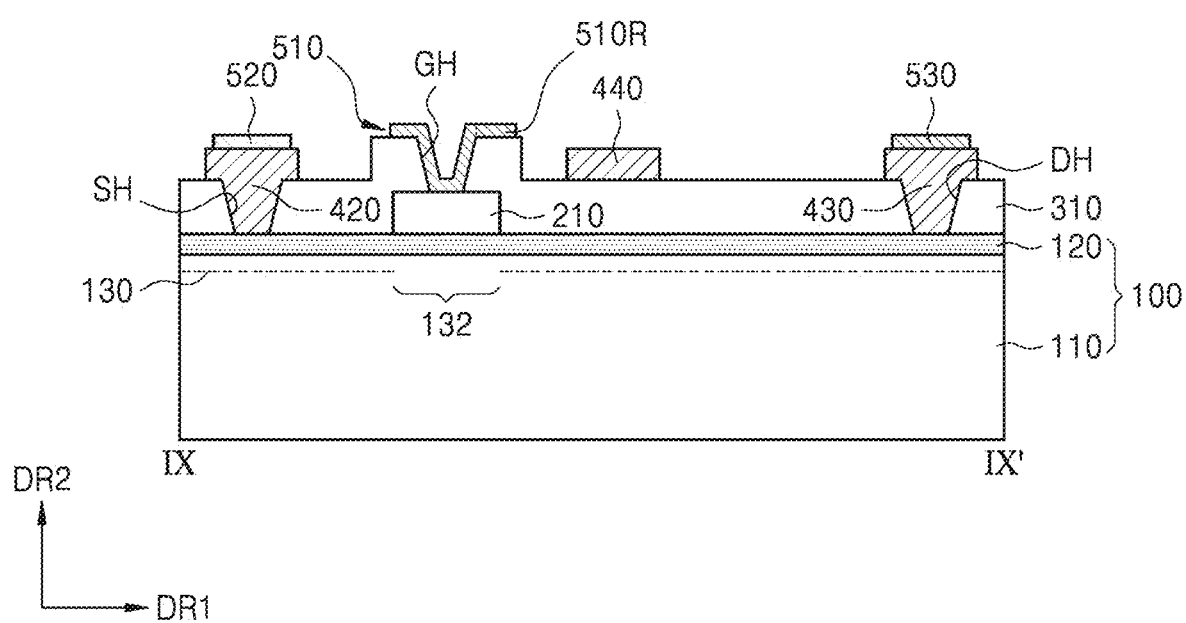
FIG. 34 is a cross-sectional view of a power semiconductor device taken along line IX-IX' of FIG. 33.

FIG. 33 is a plan view of a power semiconductor device according to an embodiment. FIG. 34 is a cross-sectional view of the power semiconductor device taken along line IX-IX' of FIG. 33. For brevity of description, descriptions that are substantially the same as those given above with reference to FIGS. 31 and 32 may be omitted.

Referring to FIGS. 33 and 34, a power semiconductor device 19 may be provided. The power semiconductor device 19 may be substantially the same as the power semiconductor device 18 described with reference to FIGS. 31 and 32, except for the shapes of the additional source electrode pattern 520 and the additional drain electrode pattern 530.

Unlike the description given with reference to FIGS. 31 and 32, the additional source electrode pattern 520 may not be provided on the side surfaces of the source electrode pattern 420. The additional source electrode pattern 520 may be provided only on the upper surface of the source electrode pattern 420. Although it is illustrated in FIG. 33 that the additional source electrode pattern 520 is smaller than the source electrode pattern 420, this is merely an example. In another example, the additional source electrode pattern 520 and the source electrode pattern 420 may completely overlap each other. In other words, the upper surfaces of the additional source electrode pattern 520 and the source electrode pattern 420 may have the same area. The source electrode pattern 420 may be exposed between the additional source electrode pattern 520 and the passivation layer 310.

The additional drain electrode pattern 530 may not be provided on the side surfaces of the drain electrode pattern 430. The additional drain electrode pattern 530 may be provided only on the upper surface of the drain electrode pattern 430. Although it is illustrated in FIG. 25 that the additional drain electrode pattern 530 is smaller than the drain electrode pattern 430, this is merely an example. In another example, the additional drain electrode pattern 530 and the drain electrode pattern 430 may completely overlap each other. In other words, the upper surfaces of the additional drain electrode pattern 530 and the drain electrode pattern 430 may have the same area. The drain electrode pattern 430 may be exposed between the additional drain electrode pattern 530 and the passivation layer 310.

The disclosure may provide the power semiconductor device 19 having improved electrical characteristics.

The disclosure may provide a power semiconductor device having improved electrical characteristics.

The disclosure may provide a method of manufacturing a power semiconductor device having improved electrical characteristics.

The disclosure may provide a method of manufacturing a power semiconductor device with improved process efficiency.

In embodiments discussed above, the gate electrode pattern 410 and Schottky barrier metal pattern 510, alone or in combination, may be referred to as a gate structure.

Figure 35:
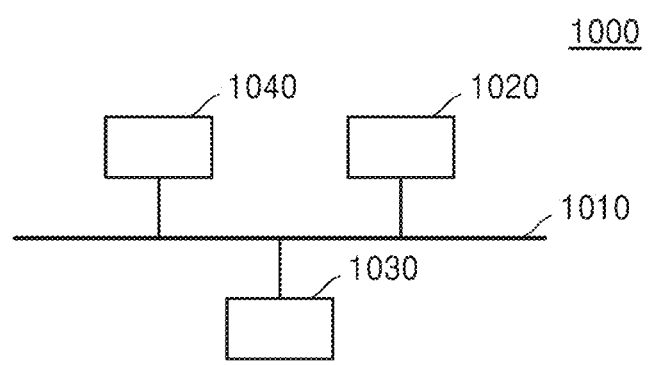
FIG. 35 is a schematic of an electronic device according to an embodiment.

FIG. 35 is a schematic of an electronic device according to an embodiment.

Referring to FIG. 35, the electronic device 1000 includes one or more electronic device components, including a processor (e.g., processing circuitry) 1020 and a memory 1030 that are communicatively coupled together via a bus 1010.

The processing circuitry 1020, may be included in, may include, and/or may be implemented by one or more instances of processing circuitry such as hardware including logic circuits, a hardware/software combination such as a processor executing software; or a combination thereof. For example, the processing circuitry 1020 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1030 may include a non-transitory computer readable storage device, for example a solid state drive (SSD), storing a program of instructions, and the processing circuitry 1020 may be configured to execute the program of instructions to implement the functionality of the electronic device 1000.

In some example embodiments, the electronic device 1000 may include one or more additional components 1040, coupled to bus 1010, which may include, for example, a power supply, a light sensor, a light-emitting device, any combination thereof, or the like. In some example embodiments, one or more of the processing circuitry 1020, memory 1030, or one or more additional components 1040 may include any power semiconductor device 10 to 19 according to any of the example embodiments described herein.

However, the effects of the disclosure are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a power semiconductor device, the method comprising:
   forming a channel separation pattern on a substrate;
   forming a passivation layer on the substrate and the channel separation pattern; and
   forming a gate electrode pattern, a source electrode pattern, and a drain electrode pattern penetrating the passivation layer in a same process step,
   wherein the gate electrode pattern is formed on the channel separation pattern, and
   a side surface of the gate electrode pattern and a side surface of the channel separation pattern have a step difference.

2. The method of claim 1, wherein the forming the gate electrode pattern, the source electrode pattern, and the drain electrode pattern includes:
   forming a gate hole, a source hole, and a drain hole penetrating the passivation layer;
   filling the gate hole, the source hole, and the drain hole by depositing a conductive material layer on the passivation layer; and
   patterning the conductive material layer,
   wherein the gate electrode pattern, the source electrode pattern, and the drain electrode pattern are formed in the gate hole, the source hole, and the drain hole, respectively.

3. The method of claim 2,
   wherein the gate electrode pattern includes an electric field relaxation region extending toward the drain electrode pattern along an upper surface of the passivation layer, and
   a distance between the electric field relaxation region and the drain electrode pattern is less than a distance between the channel separation pattern and the drain electrode pattern.

4. The method of claim 1, further comprising:
   forming a Schottky barrier metal pattern between the channel separation pattern and the gate electrode pattern.

5. The method of claim 4,
   wherein the Schottky barrier metal pattern extends between the gate electrode pattern and the passivation layer.

6. The method of claim 1, further comprising forming:
   an electric field relaxation pattern between the gate electrode pattern and the drain electrode pattern,
   wherein the electric field relaxation pattern is formed in the same process step as the gate electrode pattern, the source electrode pattern, and the drain electrode pattern.

7. The method of claim 6, wherein the forming of the gate electrode pattern, the source electrode pattern, the drain electrode pattern, and the electric field relaxation pattern includes:
   forming a gate hole, a source hole, and a drain hole penetrating the passivation layer;
   filling the gate hole, the source hole, and the drain hole by depositing a conductive material layer on the passivation layer; and
   patterning the conductive material layer.

8. The method of claim 1,
   wherein the gate electrode pattern, the source electrode pattern, and the drain electrode pattern include a same conductive material.

9. The method of claim 1,
   wherein the channel separation pattern includes p-type gallium nitride (GaN).

10. A power semiconductor device comprising:
    a substrate including a channel;
    a channel separation pattern on the substrate; a passivation layer on the substrate and the channel separation pattern, the passivation layer including a gate hole, a source hole, and a drain hole penetrating the passivation layer; and
    a gate electrode pattern, a source electrode pattern, and a drain electrode pattern in the gate hole, the source hole, and the drain hole, respectively, and extending onto an upper surface of the passivation layer, wherein a side surface of the gate electrode pattern in the gate hole and a side surface of the channel separation pattern have a step difference, and
    wherein the gate electrode pattern, the source electrode pattern, and the drain electrode pattern include a same conductive material.

11. The power semiconductor device of claim 10, wherein the source electrode pattern does not extend over the gate electrode pattern.

12. The power semiconductor device of claim 10, further comprising:
    a Schottky barrier metal pattern between the gate electrode pattern and the channel separation pattern,
    wherein the Schottky barrier metal pattern includes a conductive material different from those of the gate electrode pattern, the source electrode pattern, and the drain electrode pattern.

13. The power semiconductor device of claim 10,
    wherein the channel separation pattern includes p-type gallium nitride (GaN).

14. The power semiconductor device of claim 10,
    wherein the gate electrode pattern includes an electric field relaxation region extending toward the drain electrode pattern along an upper surface of the passivation layer, and
    a distance between the electric field relaxation region and the drain electrode pattern is less than a distance between the channel separation pattern and the drain electrode pattern.

15. The power semiconductor device of claim 10, further comprising:
an electric field relaxation pattern between the gate electrode pattern and the drain electrode pattern.

16. A power semiconductor device comprising:
a substrate including a channel;
a channel separation pattern on the substrate;
a passivation layer on the substrate and the channel separation pattern, the passivation layer including a gate hole, a source hole, and a drain hole penetrating the passivation layer; and
a gate structure, a source electrode pattern, and a drain electrode pattern in the gate hole, the source hole, and the drain hole, respectively, and extending onto an upper surface of the passivation layer,
wherein a width of a bottom surface of the gate structure in a first direction is less than a width of an upper surface of the channel separation pattern in the first direction,
wherein the gate structure includes a gate electrode pattern,
wherein the gate electrode pattern, the source electrode pattern, and the drain electrode pattern include a same conductive material, and
the source electrode pattern does not vertically overlap the gate electrode pattern.

17. The power semiconductor device of claim 16,
wherein the gate electrode pattern directly contacts the channel separation pattern, and
a side surface of a portion of the gate electrode pattern in the gate hole and a side surface of the channel separation pattern have a step difference.

18. The power semiconductor device of claim 16,
wherein the gate structure includes a Schottky barrier metal pattern on the channel separation pattern.

19. The power semiconductor device of claim 18, wherein
a side surface of a portion of the Schottky barrier metal pattern in the gate hole and a side surface of the channel separation pattern have a step difference.

20. The power semiconductor device of claim 16,
wherein the channel separation pattern includes p-type gallium nitride (GaN).

* * * * *